United States Patent [19]

DiMassimo et al.

[11] Patent Number: 4,536,759

[45] Date of Patent: Aug. 20, 1985

[54] MULTI-FORMAT DATA DISPLAY

[75] Inventors: Donald V. DiMassimo; John B. May, both of Liverpool; Michael D. Lemmon, Syracuse, all of N.Y.

[73] Assignee: General Electric Company, Somersworth, N.H.

[21] Appl. No.: 513,262

[22] Filed: Jul. 14, 1983

Related U.S. Application Data

[63] Continuation of Ser. No. 238,477, Feb. 26, 1981, abandoned.

[51] Int. Cl.³ .............................................. G09G 3/14
[52] U.S. Cl. ................................... 340/706; 340/760; 340/717
[58] Field of Search ..................... 340/706, 760, 717

[56] References Cited

U.S. PATENT DOCUMENTS

| 3,388,380 | 6/1968 | Coffin, Jr. et al. | 340/790 |
| 3,932,859 | 1/1976 | Kyriakides et al. | 340/804 |
| 4,122,444 | 10/1978 | Kitajima et al. | 340/765 |
| 4,153,950 | 5/1979 | Nosowicz et al. | 340/789 |
| 4,161,719 | 7/1979 | Parikh et al. | 370/82 |
| 4,205,200 | 5/1980 | Parikh et al. | 370/83 |
| 4,381,505 | 4/1983 | Dion | 340/760 |
| 4,408,869 | 10/1983 | Tomosada et al. | 340/706 |
| 4,438,432 | 3/1984 | Hurcum | 340/717 |

Primary Examiner—Marshall M. Curtis
Attorney, Agent, or Firm—Robert E. Brunson

[57] ABSTRACT

A display controller drives a nine digit, seven segment display in accordance with desired display formats for preselected lengths of time. The controller accepts control commands and data by means of a serial three wire asynchronous link. The display controller includes the capability for receiving binary data and converting it to binary coded decimal data for subsequent display and further includes the capability for scaling data as well as performing self tests to insure that the display is functioning correctly following a power outage.

14 Claims, 23 Drawing Figures

FIG. 6

| Y\X | 0 | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|---|
| 0 | NIBBLE COUNT | FORMAT CODE | | | COMM INPUT SCRATCH REGISTER ($2^{32}-1$ MAX) (BINARY INPUT TO CONVERSION) | | | | | | | BIT COUNT REGISTER | WORD COUNT REGISTER | K MEMORY | ZERO COUNT REGISTER |
| 1 | | BCD LOOP COUNTER | | | BINARY-BCD CONVERSION SCRATCH REGISTER | | | | | | | BLANK OR "-" | (SCRATCH REGISTER) | | | |
| 2 | | | | | BCD ANSWER AFTER CONVERSION ($4 \times 10^9$ MAX) | | | | | | | MSD | (BCD REGISTER) | | | |
| 3 | | KH REGISTER | | | | | ID # REGISTER | | | KWDP LOCATION REGISTER | SCROLL FLAG / MSG FLAG / KW FLAG | DISP TIME REGISTER | BLOCK DIVIDE REGISTER | POSITION 6 OF KWH AND DEMAND | | |
| | LSD | | | | | | LSD | | MSD | | | | | | | |

FIG. 7

| Y\X | 0 | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|---|
| 0 | \multicolumn{16}{l}{KH FOR MULTIPLY} | | | | | | | | | | | | | | | |
| 1 | LSD → BCD # PULSES FROM X=2 REGISTER AND BCD CONVERSION | | | | | | | | | | | | | | | |
| 2 | LSD → BCD WATT HOURS AFTER BCD MULTIPLY OF BCD # PULSES * KH → MSD | | | | | | | | | | | | | | | |
| 3 | LSD → KH REGISTER → MSD | ID # REGISTER (LSD→MSD) | | | KWDP LOCATION REGISTER | SCROLL FLAG / MSG FLAG / kW FLAG | DISP TIME REGISTER | | BLOCK DIVIDE REGISTER | FRMT CODE TEMP REGISTER | | | | | | |

(Row 0: "KH FOR MULTIPLY" spans columns 1–4)
(Row 1: "BCD # PULSES FROM X=2 REGISTER AND BCD CONVERSION" with LSD at col 0)
(Row 2: "BCD WATT HOURS AFTER BCD MULTIPLY OF BCD # PULSES * KH", LSD at col 0, MSD at col 9)
(Row 3: LSD at col 0, "KH REGISTER" through col 4, MSD at col 5; ID # REGISTER LSD col 6, MSD col 8; KWDP LOCATION REGISTER col 9; flags at col 10; DISP TIME REGISTER col 11; BLOCK DIVIDE REGISTER col 12; FRMT CODE TEMP REGISTER col 13)

MULTI-FORMAT DATA DISPLAY

This application is a continuation of application Ser. No. 238,477, filed 2/26/81, now abandoned.

BACKGROUND OF THE INVENTION

I. Field of the Invention

This invention relates generally to data display systems and more particularly to systems for displaying data in various formats for preselectable lengths of time.

II. Description of the Prior Art

Various types of multi-format data displays are well known in the art and many have been in use for quite some time. Representative of such displays include those having cathode-ray tubes for displaying selected data in selectable formats, hard copy printers, which also can display requested data in selectable formats, and customized displays developed for particular applications. These prior art multiple format displays have at least one common bond in that they are usually complex and expensive.

In addition to being complex and expensive, many have sophisticated interface requirements in order to be able to communicate with equipment which is providing the raw data to the display. In these prior art devices, it is usually necessary to make a trade-off between expensive and versatility of the display. For instance, one might be able to obtain a relatively inexpensive display, for example a digital clock display; however, this type of display is inflexible in that it is specifically limited to that particular format. At the other end of the spectrum, there are complex cathode-ray tube (CRT) data terminals which contain their own sophisticated control equipment and which are capable of displaying data in a multitude of formats, for various time durations, all of which are selectable by the data source equipment, stored programs, and/or the display operator. Intermediate these extremes are those terminals, which require extensive control from the logic system whose data is being displayed in order to vary the format and display time. Although these latter terminals are not as expensive and complex as the aforementioned CRT terminals, they require extensive external control and relatively complex interface communications in many cases.

Therefore, a need exists for an inexpensive display which is capable of displaying data in various formats and for various lengths of time. In addition, a need exists for a display which is capable of accepting data in different formats and reformatting this data to the desired display format.

SUMMARY OF THE INVENTION

The aforementioned needs are met by the present invention which provides an inexpensive variable format display.

The apparatus of the present invention comprises a display controller which drives a display. The data interface is accomplished by a serial three wire asynchronous link which carries all control commands and data, between the controller and the apparatus generating the raw data.

In addition, the display controller provides the necessary signals to drive a nine digit, seven segment display in accordance with the desired display formats and for the preselected length of time. The display controller also provides the capability for receiving binary data and converting it to binary coded decimal data for subsequent display. The controller further includes the capability for scaling data as well as performing self tests to insure that the display is functioning correctly following a power outage.

It is therefore an object of the present invention to provide an inexpensive multi-format data display.

It is another object of the present invention to provide a display in which the length of display time as well as the display format is preselectable.

A still further object of the present invention is to provide a multi-format apparatus including the capability for binary to binary coded decimal conversion of data to be displayed.

Yet another object of the present invention is to provide a display apparatus including the capability for scaling of data to be displayed.

BRIEF DESCRIPTION OF THE DRAWINGS

Other objects, features and advantages of the present invention will become more fully apparent from the following detailed description of the preferred embodiment, the appended claims and the accompanying drawing in which:

FIG. 6 depicts a memory map showing memory locations in the random access memory of the processor/controller used by it to perform binary to binary coded decimal conversions.

FIG. 7 depicts a memory map showing memory locations in the random access memory of the processor/controller used by it to perform binary coded decimal multiplication.

Description of the Preferred Embodiment

Figure 1:
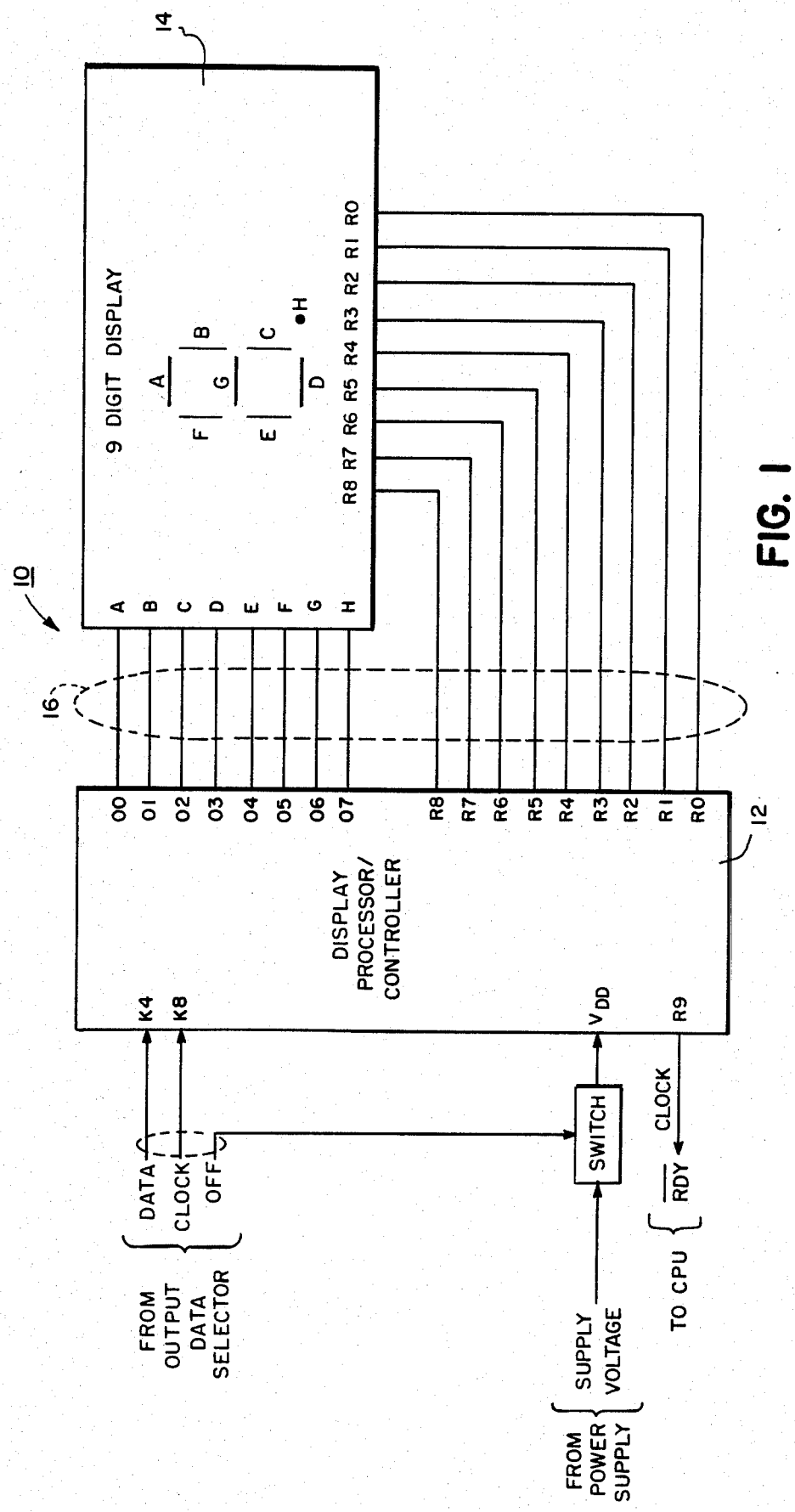
FIG. 1 is a schematic block diagram depicting the preferred embodiment of a multi-format display apparatus in accordance with the present invention.

Referring to FIG. 1, there is shown a schematic block diagram of the preferred embodiment of a multi-format display apparatus of the present invention, generally designated 10. The display apparatus 10, comprises a display processor/controller 12 and a display device 14. In the preferred embodiment, the display processor/controller is a Texas Instrument type TMS 1070 microcomputer as shown and described in the Texas Instruments, Inc. publication entitled "TMS 1000 Series Data Manual MOS/LSI One-Chip Microcomputers" dated December, 1976, which publication is hereby encorporated by reference as if fully set forth herein. The display device 14, is preferably a Futaba model number 9-ST-68 9-Digit Vacuum Flourescent Display as shown and described in the Futaba Corporation Publication entitled "Flourescent Display Panel" 1979 Edition, Page 5, which publication is hereby incorporated by reference as if fully set forth herein.

The "O" outputs 00 through 07 of the display processor/controller 12 are electrically connected to the segment control inputs A through H respectively of the display device 14 by means of eight electrical conductors in a display control bus 16. The "R" outputs R0 through R8 of the processor/controller 12 are electrically connected to the digit control inputs R0 through R8 respectively of the display device 14 by means of nine electrical conductors of the display control bus 16. Serial asynchronous data is received through input K4 of the display/controller 12. A clock signal is received through input K8 and a clock or ready signal, is output from output R9 of the display processor/controller 12. In the preferred embodiment, power to the display processor/controller 12 is remotely controlled by means of a signal applied to an electronic switch 62 which selectively controls the application of the appropriate supply voltage, the characteristics of which are set forth in the aforementioned Texas Instrument publication.

Figure 2:
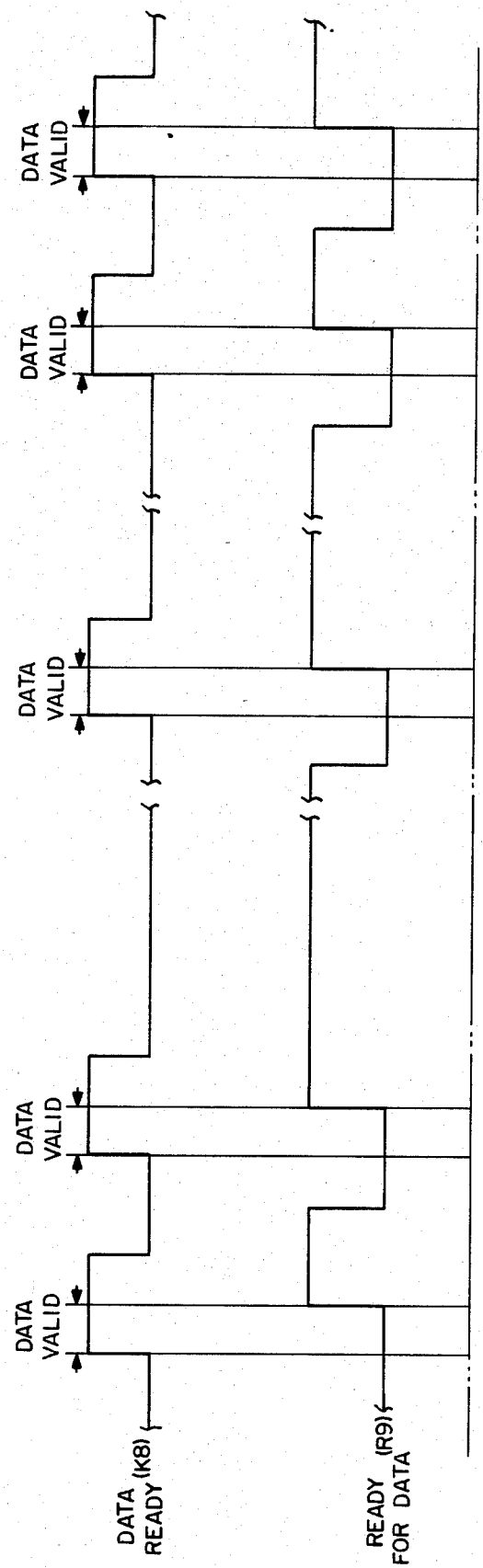
FIG. 2 is a timing diagram illustrating the relationship between clock and data signals for transmitting data to a multi-format display in accordance with the present invention.

All data and control is accomplished by a three wire serial link which is connected to the K4 and K8 inputs and the R9 output of the display processor/controller 12. The FIG. 2 is a timing diagram illustrating the relationship between the clock and data signals in transmission of data to the controller 12. As shown in FIG. 2, a transition of the signal at R9 from high to low signifies that the controller 12 is ready for data and that the data is clocked in by the signal input to the controller at K8.

Figure 3:
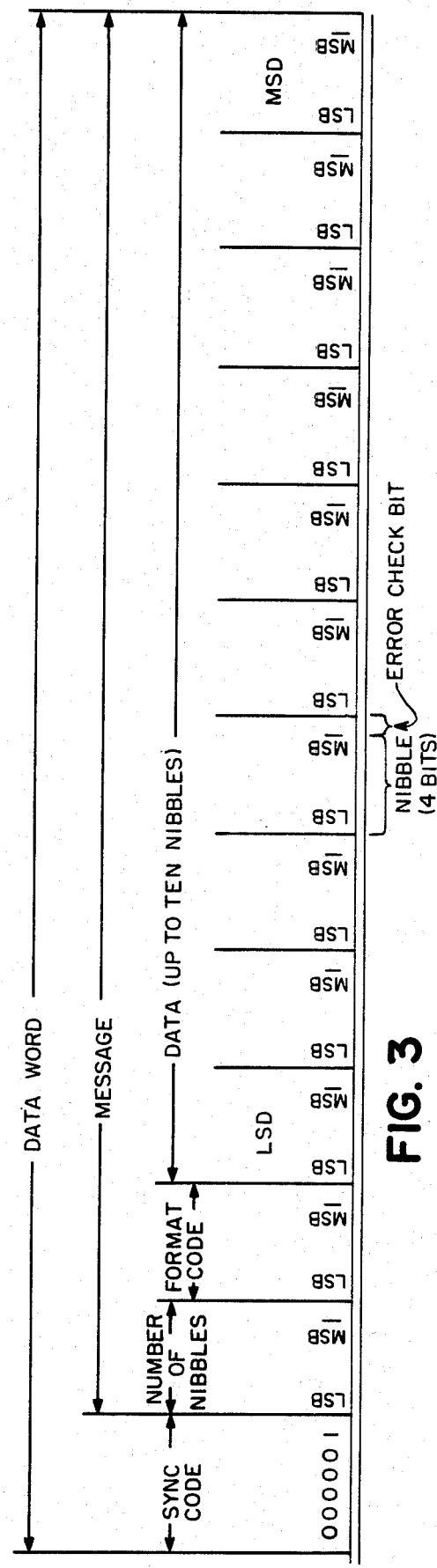
FIG. 3 depicts a preferred embodiment format of a data word receivable by the multi-format display apparatus of the present invention.
Figure 4:
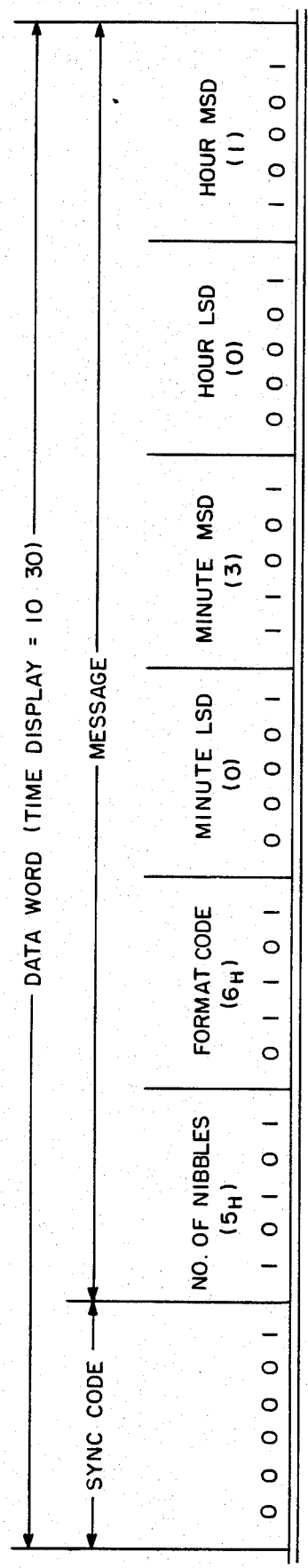
FIG. 4 depicts a preferred embodiment format of a time display message receivable by the multi-format display of the present invention.

The preferred embodiment protocol for data transmission insures error checking should incorrect data be received. In FIG. 3, there is shown a preferred embodiment data word. The data word comprises a message which is prefixed by a sync code which consists of 5 zeros followed by a 1. The message comprises up to 10 nibbles, each nibble consisting of four bits of data and is followed by a 1. The display controller 12 checks for the 1 following the four data bits in each nibble and if it is not received, begins looking for the sync code as will be subsequently described in detail.

The first nibble of the message contains data which sets forth the number of nibbles in the message minus 1. The next nibble contains a format code which tells the controller 12 what is to be done with the data received. Since there are four data bits in the format code nibble, there are sixteen possible format codes of which twelve are used. The format codes of the preferred embodiment are as follows:

| FORMAT CODE (HEXADECIMAL) | DISPLAY TYPE |
| --- | --- |
| 0 | Constants load |
| 1 | KH Display |
| 2 | Blank display |
| 3 | Message |
| 4 | Unformatted BCD Data |
| 5 | Meter ID Number |
| 6 | Time |
| 7 | Kilowatt Hour |
| 8 | Date |
| 9 | Kilowatt Demand |
| A | Kilowatt Demand |
| B | Not Used |
| C | Not Used |
| D | Not Used |
| E | Not Used |
| F | Unformatted Binary Data |

All unused format codes direct the controller 12 to data input requests in the communication link, as will be subsequently described in detail.

Figure 5:
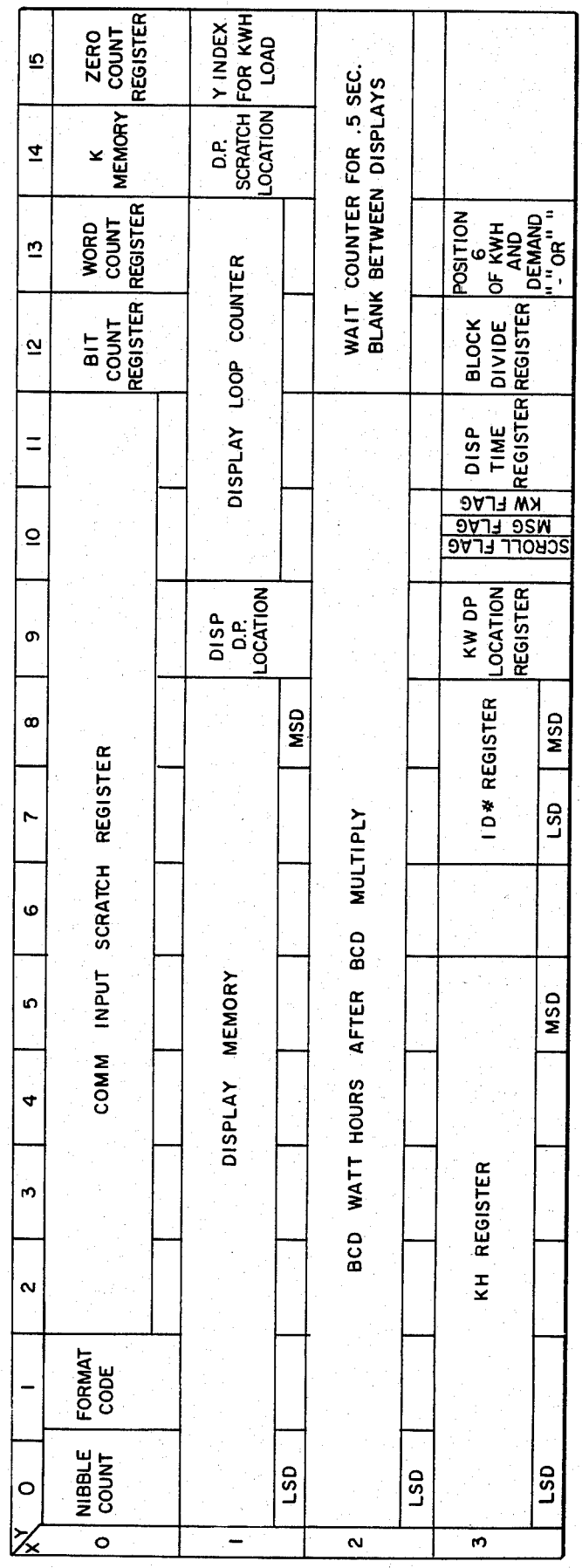
FIG. 5 depicts a map of memory locations in a random access memory of a display processor/controller, which are used by the processor/controller for all processing functions with the exception of binary to binary codes decimal conversions and binary coded decimal multiplication.

Referring now to FIG. 5, there is shown a map of memory locations in the random access memory of the controller 12. As described in detail in the aforementioned Texas Instrument publication, the random access memory has a capacity of sixty-four words organized in four files, each file containing sixteen four bit words. A Y register in the controller 12 selects one of the sixteen words in a file and an X register selects one of the four sixteen word files. For purposes of clarity and ease in understanding the description, FIG. 5 depicts the memory map in matrix form showing the files as rows and the words as columns. Hereinafter, in the detailed description, words will be referred to as nibbles. The memory map depicted in FIG. 5 shows memory locations used for all processing with the exception of binary to binary coded decimal conversions, which associated memory map is shown in FIG. 6, and binary coded decimal multiplication, the memory map associated therewith being shown in FIG. 7. The memory maps in FIGS. 6 and 7 are likewise shown in X-Y matrix form.

Figure 8:
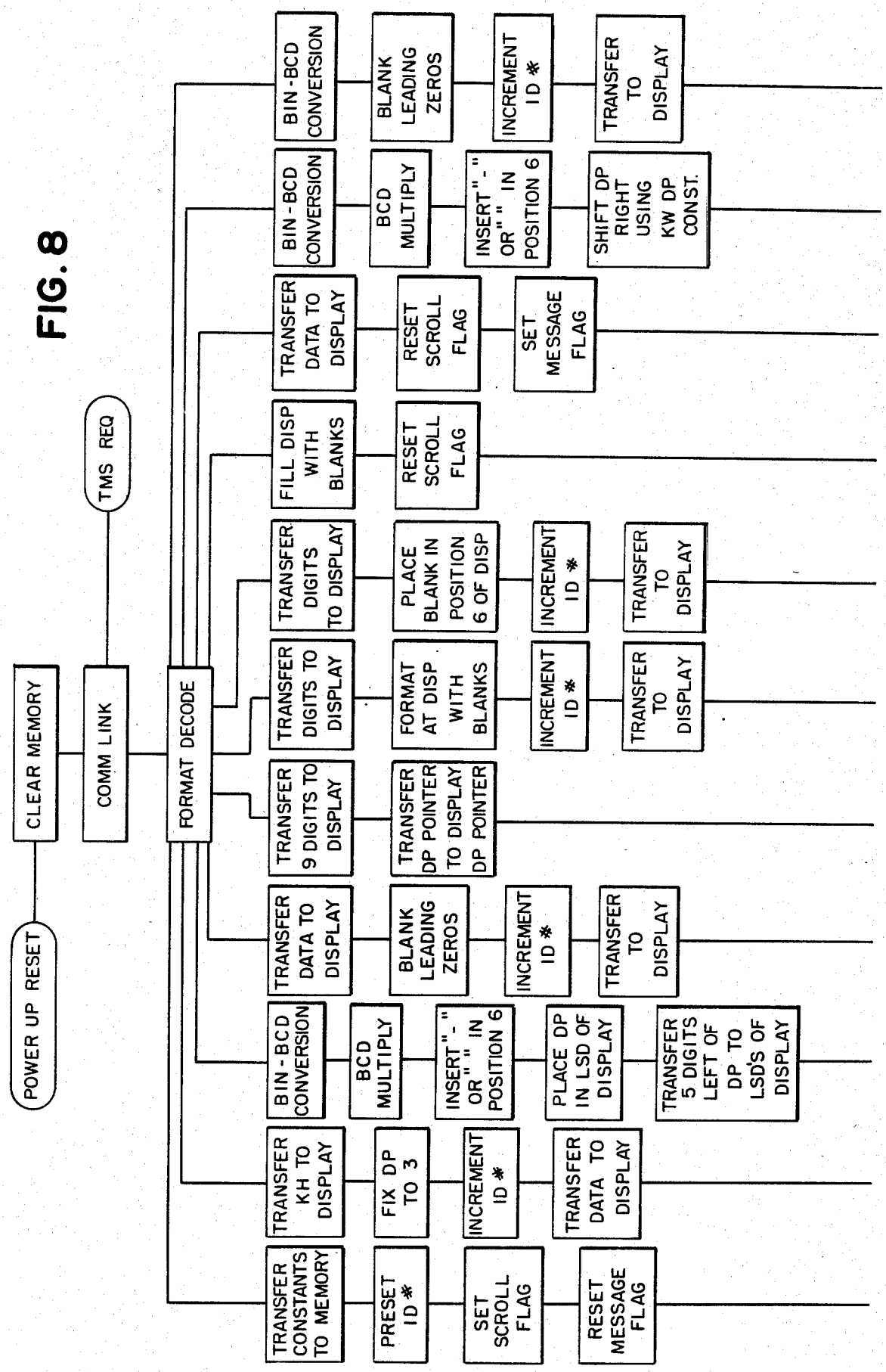
FIG. 8 is a flow chart depicting an overall view of the functions performed by the display controller of the multi-format display of the present invention.
Figure 8:
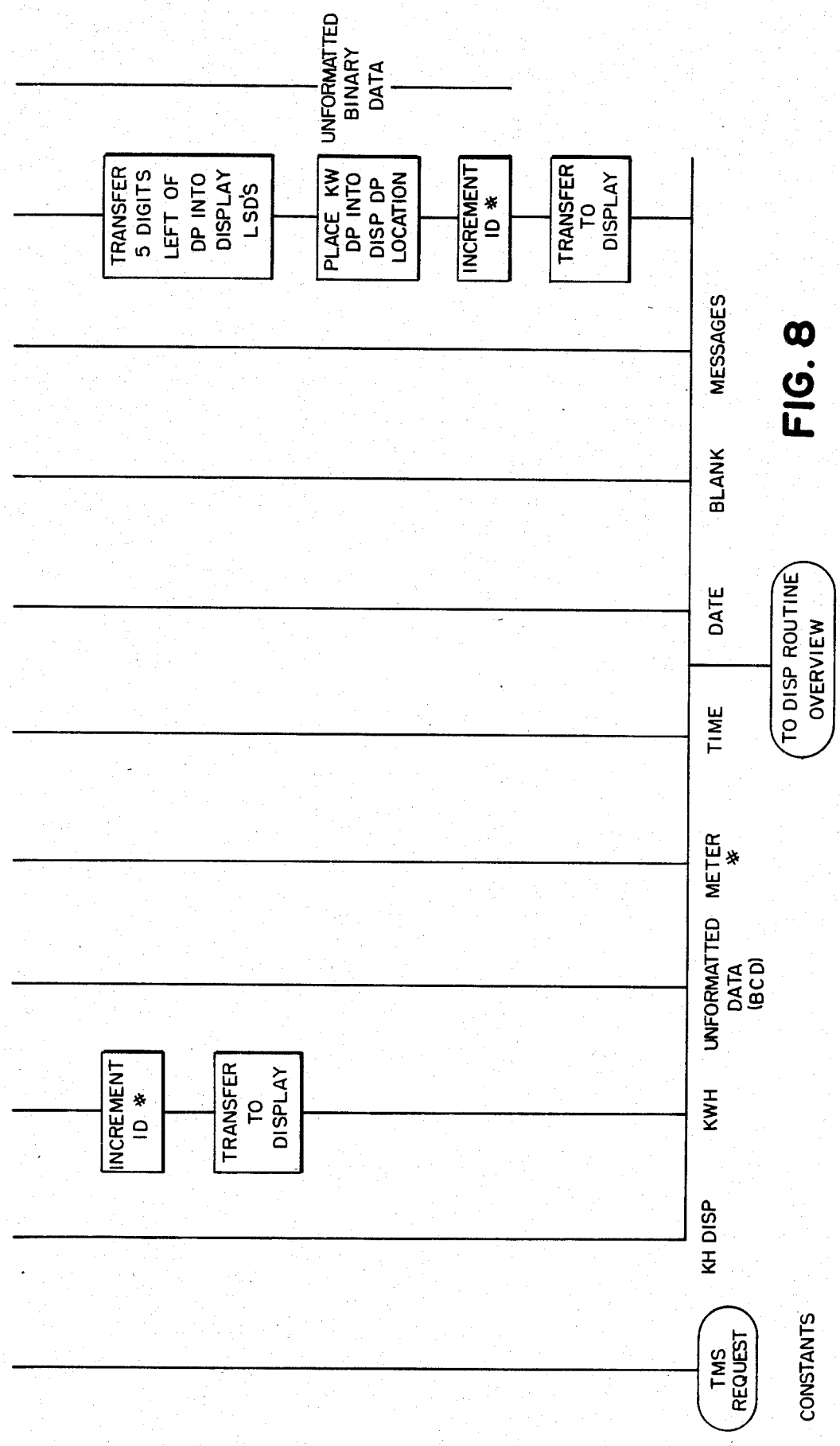

FIG. 8 depicts an overall flow diagram showing the functions performed by the processor/controller 12 of the present invention. Basically, upon application of power, the processor controller performs an initialize routine which begins by clearing all random access memory (RAM) locations and reads the K inputs. If at this time K1 is a "one", then a test routine is executed to determine that the display if functioning properly. After completion of the initialize routine, the controller 12 goes to the communication link for data.

Figure 9:
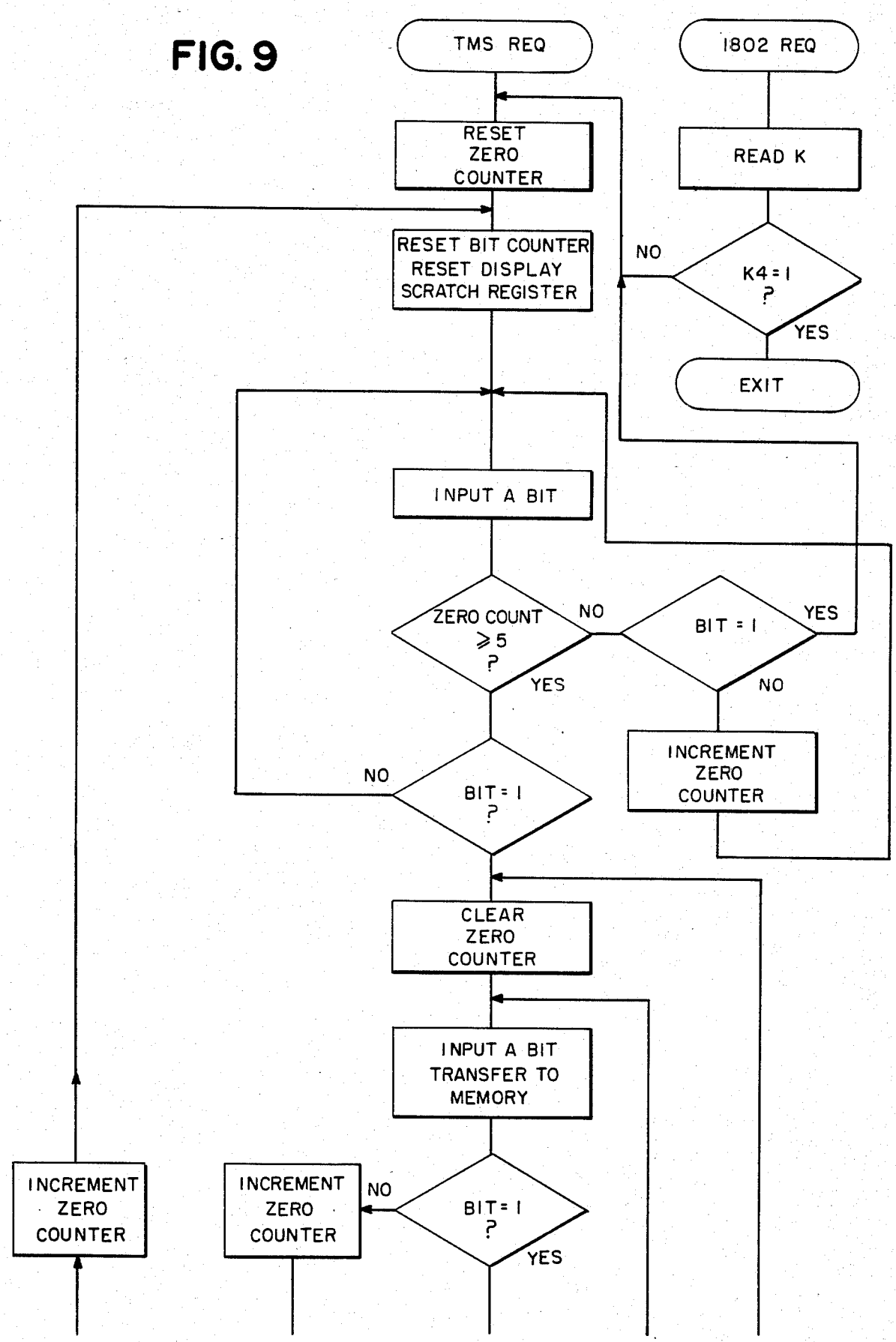
FIG. 9 is a flow chart depicting the functions performed by the processor/controller in receiving data.
Figure 9:
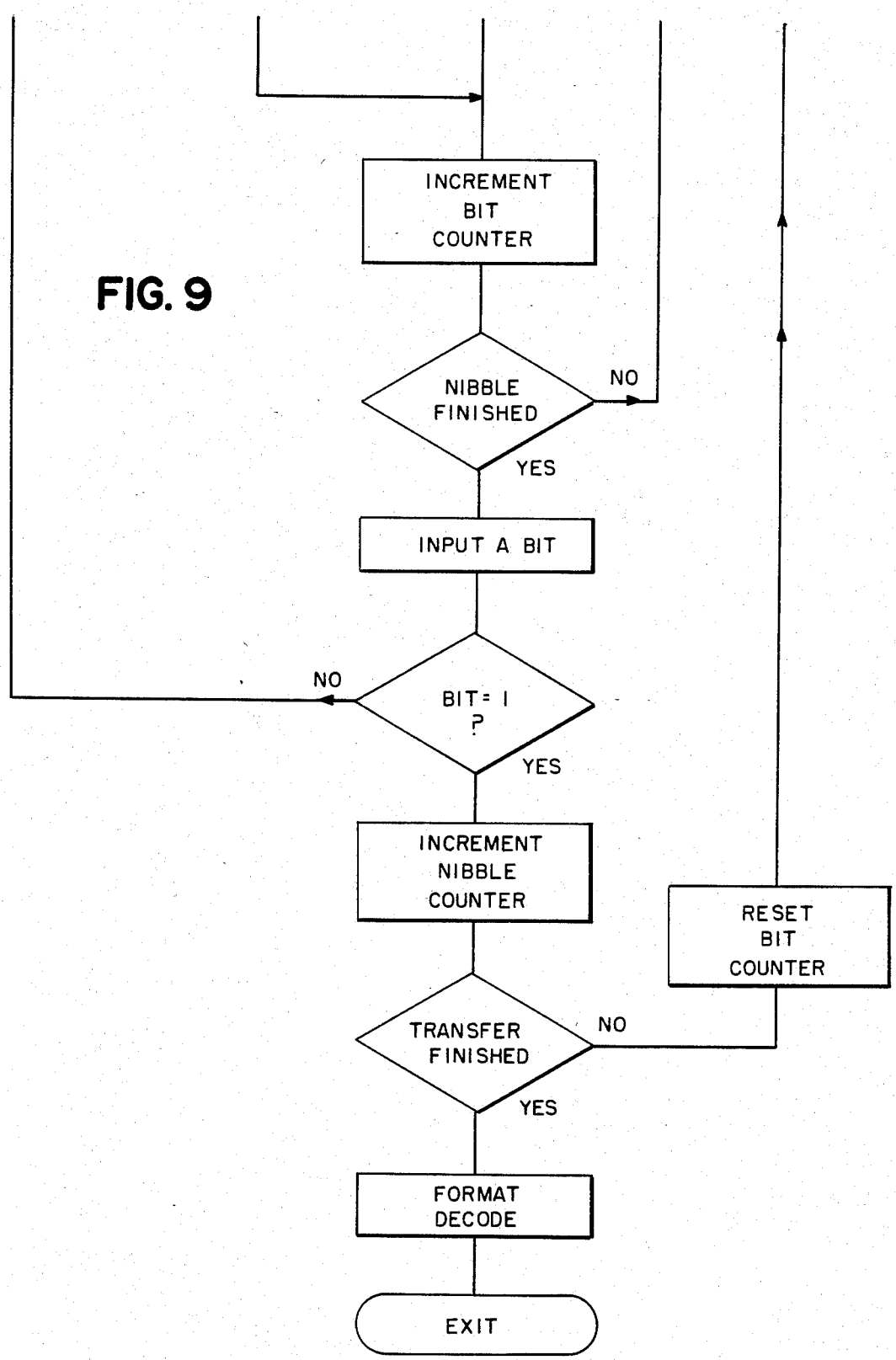

Referring now to FIG. 9, there is shown a flow chart depicting the functions performed by the controller in receiving data. First the zero counter register (see FIG. 5 for the locations in the RAM of the zero counter register and other registers to be subsequently specified) is reset to zero. Next the bit counter and display scratch register are also reset to zero. Next a bit is input.

Figure 10:
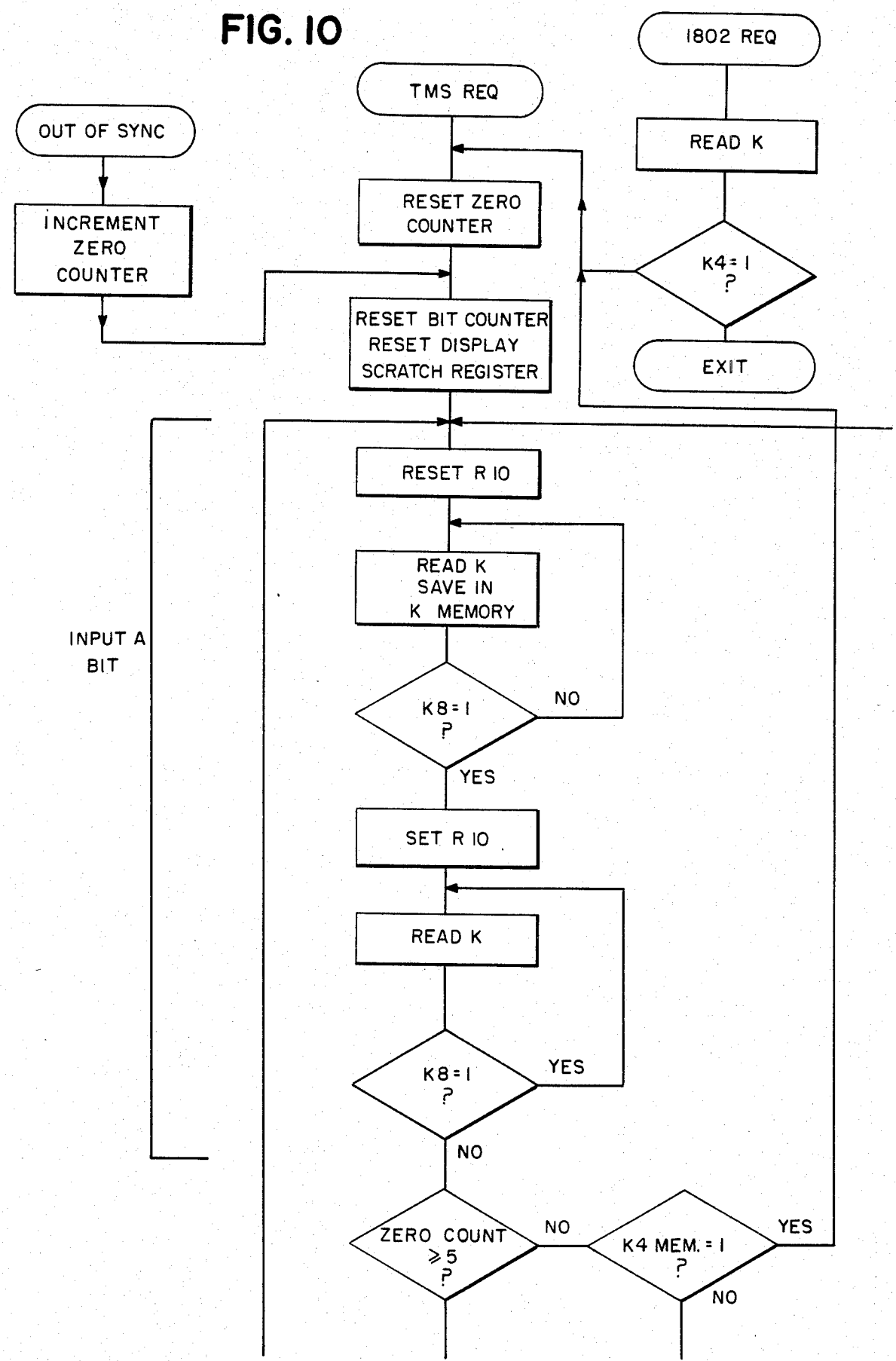
FIG. 10 is a flow chart depicting the functions performed by the processor/controller in inputting a bit.
Figure 10:
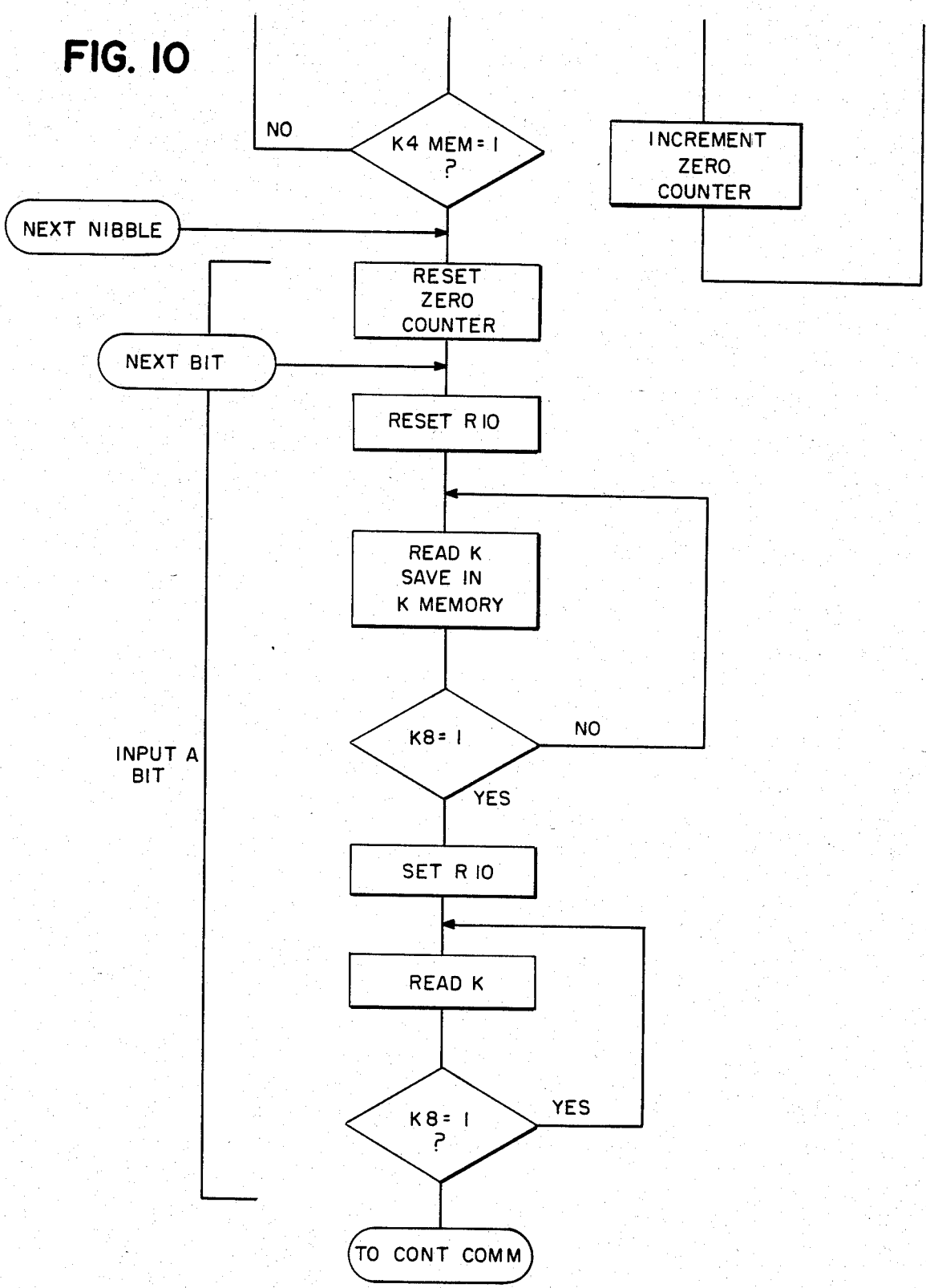

FIG. 10 shows the detailed steps carried out to input a bit. The process begins by resetting output R9 indicating that the controller 12 is ready to accept data. The K inputs (K1, K2 K4 and K8) are then read and placed in the K memory location in the RAM. K8 is then examined to determine whether or not it equals 1. If K8 equals 0, this indicates that the data received is not valid and the controller will again read the K inputs and store them in K memory thereafter testing once again for K8. If K8 equals 1, this indicates that the data is valid whereupon the controller will set R9 indicating that it is no longer ready for data. The controller will again read the K inputs and continue to read them until K8 is no longer is equal to 1. At this time, the zero counter register is tested to see whether the contents are equal to 5. If not, K4 is tested to see if it is equal to 1. If K4 is equal to 1, the controller will again return to the beginning of the process and reset the 0 counter since this indicates that a valid sync code has not been received. If K4 is a 0, the zero counter is incremented and the controller returns to that point in the process where it resets output R9 indicating that it is ready for another data bit. The process is then continued until 5 zeros have been counted. This is determined by testing the contents of the zero counter register to see when they equal five. When the contents are equal to five, the controller will then test the K4 input to see if it is equal to one. If K4 is not equal to one at this time, this indicates that a valid sync code has not been received and the controller will again reset output R9 to indicate that it is ready to accept another data bit. If K4 is equal to 1, this indicates that a valid sync code has been received and the controller is now ready to accept a data message.

Figure 11:
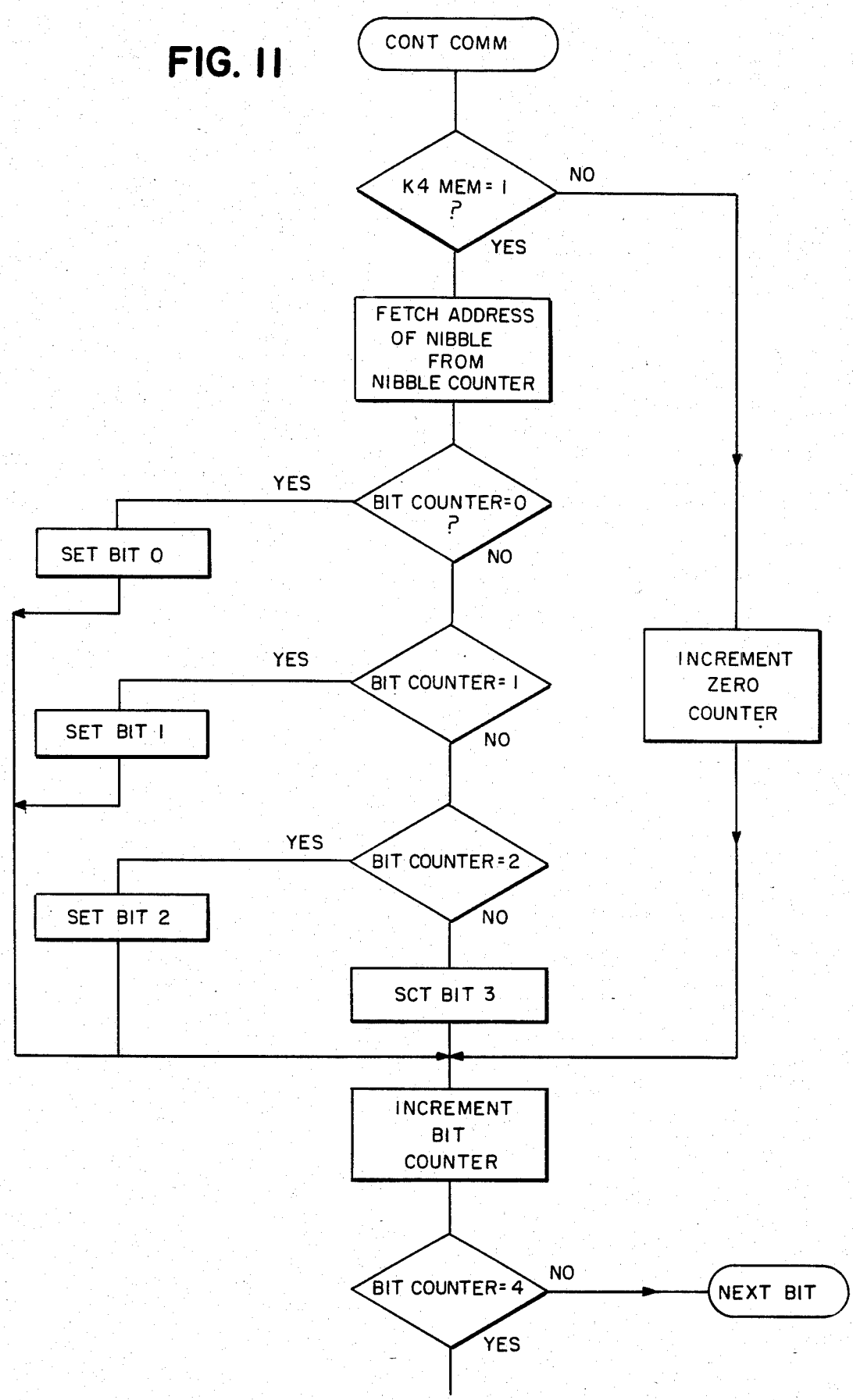
FIG. 11 is a flow chart depicting additional functions performed by the processor/controller in inputting a bit.
Figure 11:
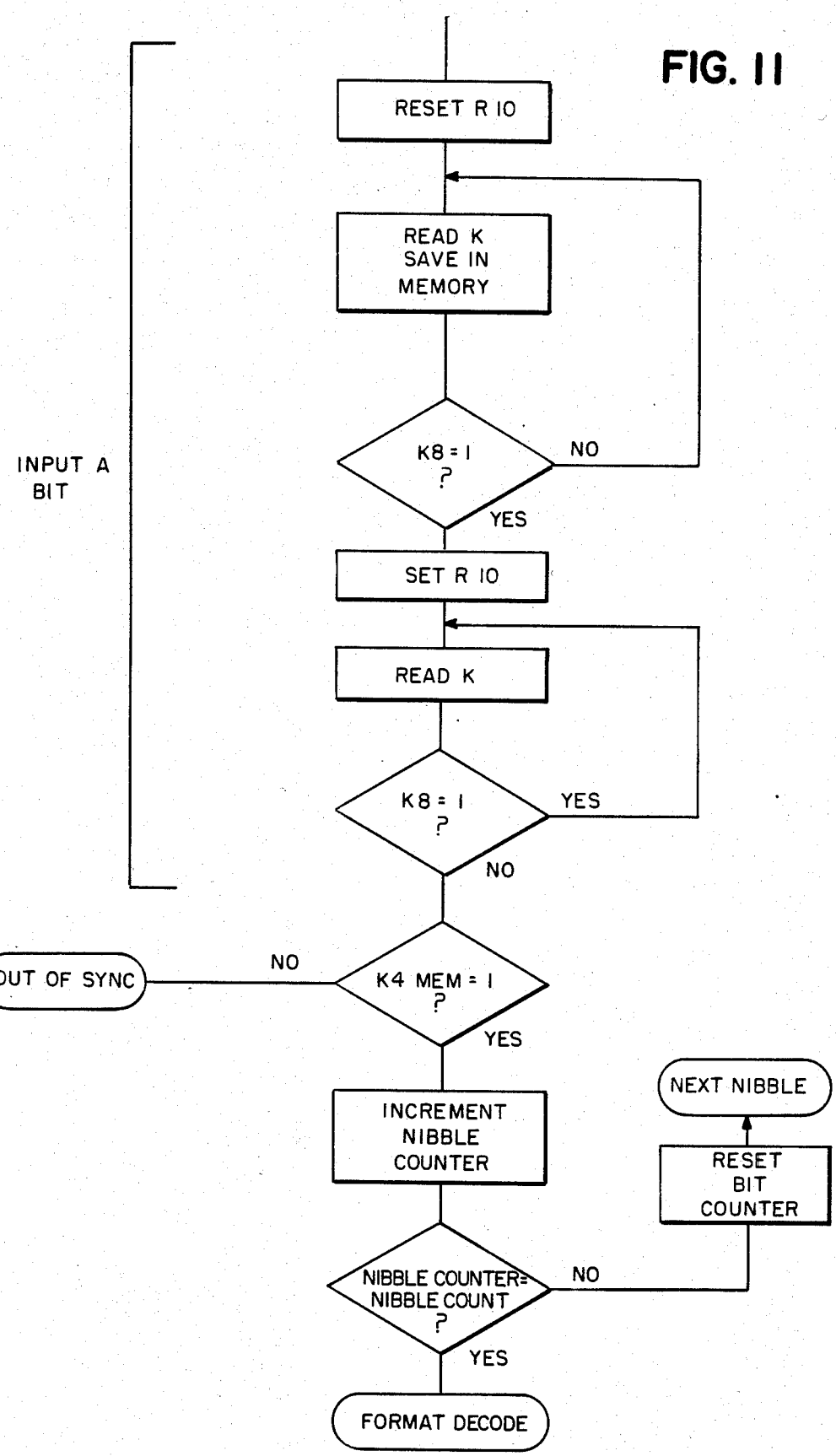

The zero counter is reset to all zeros and the R9 output is reset to zero to indicate that the controller is ready for data. The K inputs are read and stored in the K memory location and K8 tested to see whether or not it is a 1. If it is not a 1, the K inputs again are read and stored in the K memory location. If K8 equals 1 R9 is set, the K inputs are read and K8 is tested to see whether or not it equals 1 in order to insure the data received is valid, as described above. Referring now to FIG. 11, which is a continuation of the functional flow chart of FIG. 10, the K4 location of the K memory is tested to see whether or not the bit stored there is equal to 1. If not, the zero counter is incremented by one then the controller is ready to increment the bit counter and go on to the next bit in the message. If the K4 bit is equal to 1, the nibble address is fetched from a nibble counter register in RAM and the bit counter is tested to see whether or not it is equal to zero. If the bit counter is equal to zero, the controller will set bit zero at one and then continue to increment the bit counter in preparation for accepting the next bit. If the bit counter is not equal to zero, it is tested to see if it is equal to 1. If equal to 1, bit one is set. If bit counter is equal to 2, bit 2 is set and if bit counter is not equal 2, bit 3 is set. The first bit, which in the preferred embodiment is the least significant bit as shown in the format in FIG. 3, has been input, read and stored in the appropriate nibble location.

As stated above, the bit counter is incremented by one and tested to see if it is equal to four. If the bit counter is not equal to four, the next bit is input in the same fashion as described for the first bit. This continues until the bit counter is equal to four, at which time all four bits in the nibble have been input and stored. After this, the fifth bit is input and tested to see if it is equal to one. If it is not equal to one, this indicates that the data received in this nibble is erroneous since, as previously described, the fifth bit must equal one in the preferred embodiment error checking protocol. At this time, the controller will increment the zero counter, reset the bit counter and display scratch registers and proceed to input another bit as previously described (see FIG. 10). If the fifth bit is a one, as indicated by the K4 memory equal one test shown in FIG. 11, the controller will then test the nibble counter to see if it equals the nibble count which is now contained in location Y equals zero, X equals zero of the RAM. If the nibble counter contents do not equal the nibble count, the nibble counter is incremented by one, the bit counter is reset to zero and the controller begins to input the next nibble in the same fashion as described above for the first nibble. This process will continue until the nibble counter contents equal the nibble count whereupon the entire message is now stored in the communication input scratch register location in the RAM. As shown in the overall flow diagram of FIG. 8, the processor is now ready to decode the format nibble.

Figure 12:
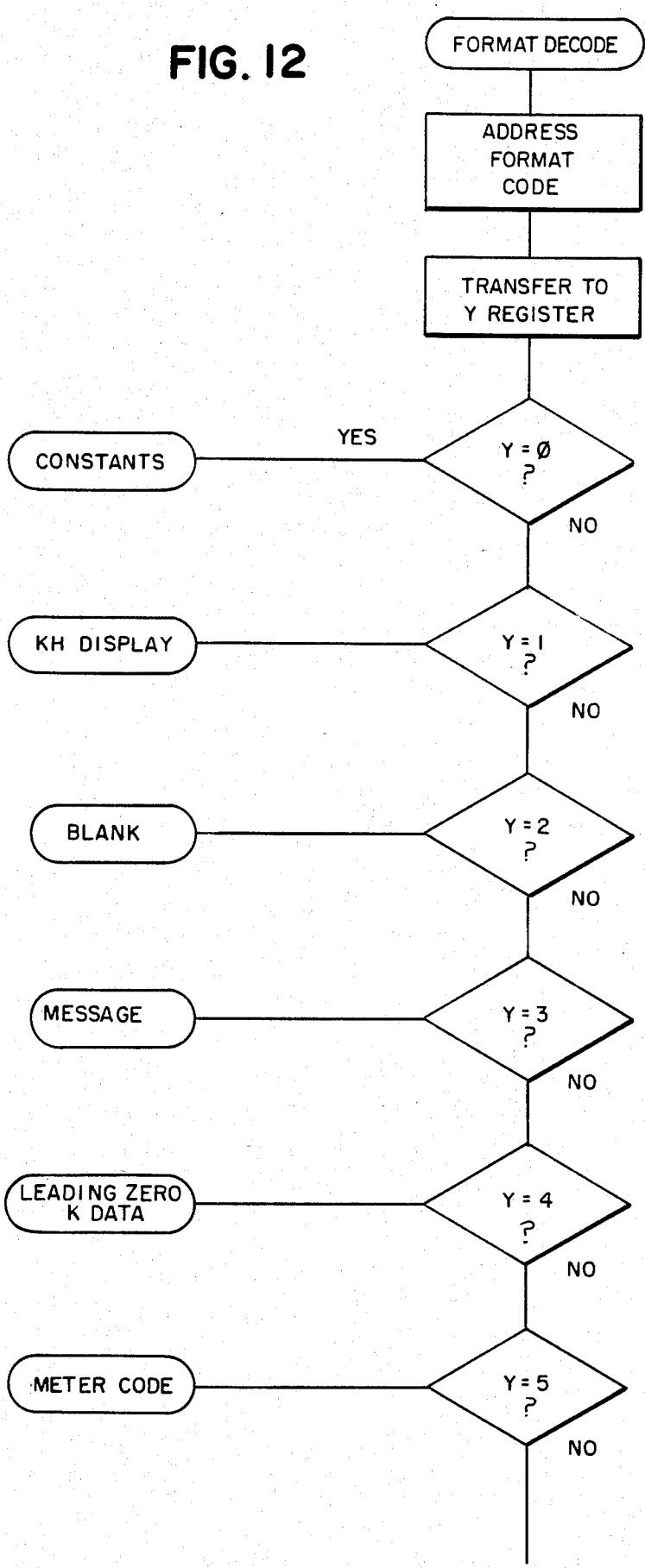
FIG. 12 is a flow chart depicting the functions performed by the processor/controller in decoding a format nibble.
Figure 12:
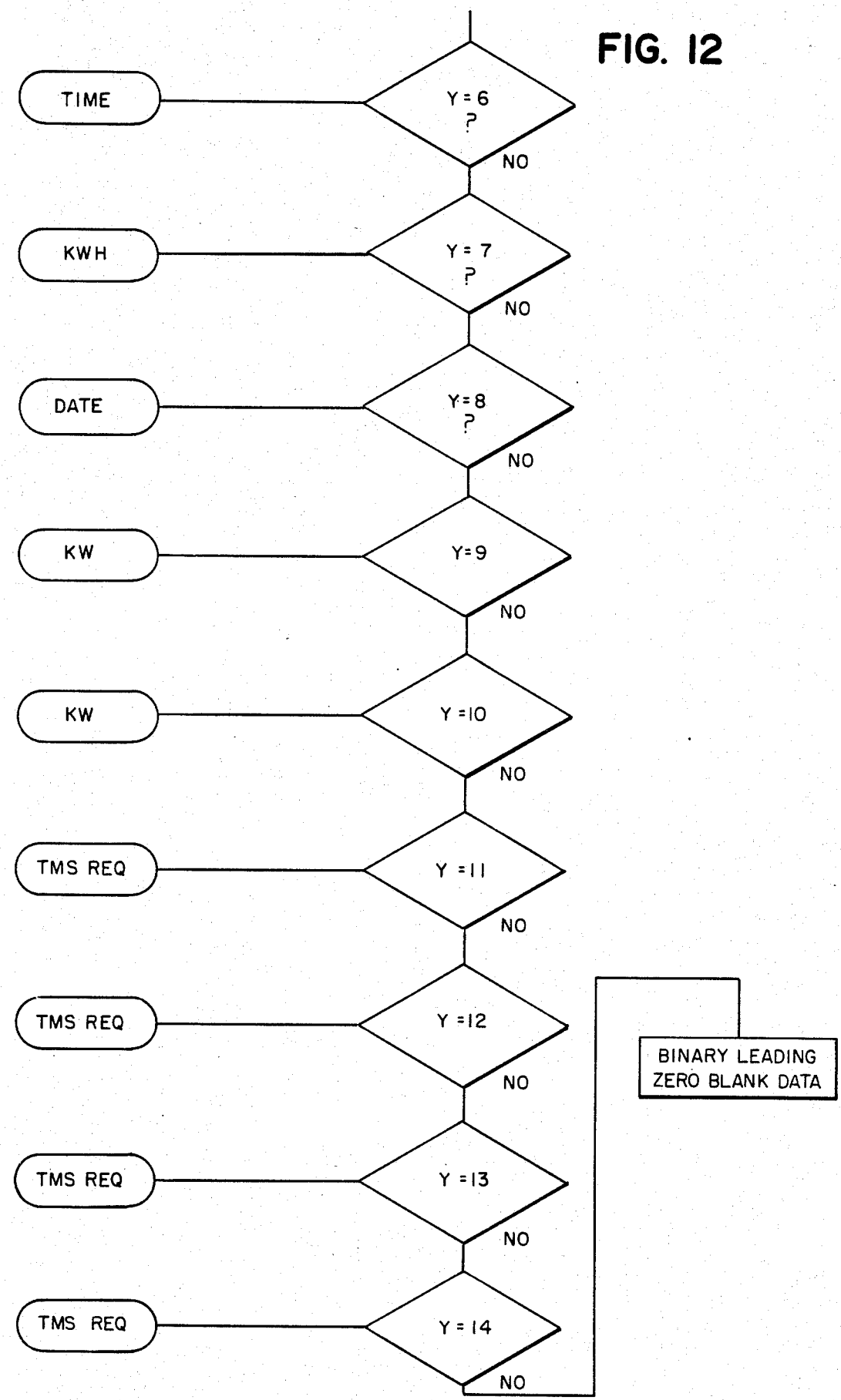

As previously mentioned, the format nibble contains sixteen possible format codes. The format nibble is decoded as shown in FIG. 12. The processor first addresses the format code and transfers this code to the Y register of the TMS 1070. The value of the contents of the Y register is then tested to determine which of the possible sixteen format codes is contained in the format code nibble. In accordance with the table previously set forth in this description, if the format code is zero, the controller then enters the constants. If it equals one, it proceeds with a Kh display routine; if it equals two, a blank display routine is performed; if three a message routine; if four a unformatted BCD data routine; if five a meter identification number display routine; if six a time routine; if seven KWH routine; if eight a date routine; if nine a KW demand routine; if ten a KW demand routine; if eleven through fourteen, the controller will immediately proceed again to request input data; and if none of the above, the controller will perform an unformatted binary data routine. The details of each of the above listed routines are described as follows.

In accordance with the preferred embodiment of the present invention, the constants routine must be loaded first in order to preset the proper flags and perform the required initializations. A constants load message contains the following information.
Number of nibbles=9

Format code=0
> Six nibbles of Kh containing a BCD quantity between 000000 and 99999.
>
> Display time data comprises 1 nibble containing a binary quantity between the values of 0 and F (hexadecimal) which determines the time each message is to be displayed as the display scrolls. In the preferred embodiment, the display time is coded as follows:

| | | |
|---|---|---|
| 0 | ≅ | 1 Second |
| 1 | ≅ | 2 Seconds |
| 2 | ≅ | 3 Seconds |
| 3 | ≅ | 4 Seconds |
| 4 | ≅ | 5 Seconds |
| 5 | ≅ | 6 Seconds |
| 6 | ≅ | 7 Seconds |
| 7 | ≅ | 8 Seconds |
| 8 | ≅ | 9 Seconds |
| 9 | ≅ | 10 Seconds |
| A | ≅ | 11 Seconds |
| B | ≅ | 12 Seconds |
| C | ≅ | 13 Seconds |
| D | ≅ | 14 Seconds |
| E | ≅ | 15 Seconds |
| F | ≅ | Until data line goes low during the display. |

KWDP location data is one nibble comprising values 0, 1, 2, or 3 which value determines the number of digits to the right of the decimal point when kilowatt demand is displayed. This will be further discussed in relation to the description of the kilowatt demand routine.

In addition to the above, the constants load routine also sets a scroll flag and resets a message flag which enables the display to scroll. The routine also resets a display quantity, called "Display ID Number", to zero. It should be noted, that in the preferred format, each displayed item has a respective display identification number as will be subsequently described.

Figure 13:
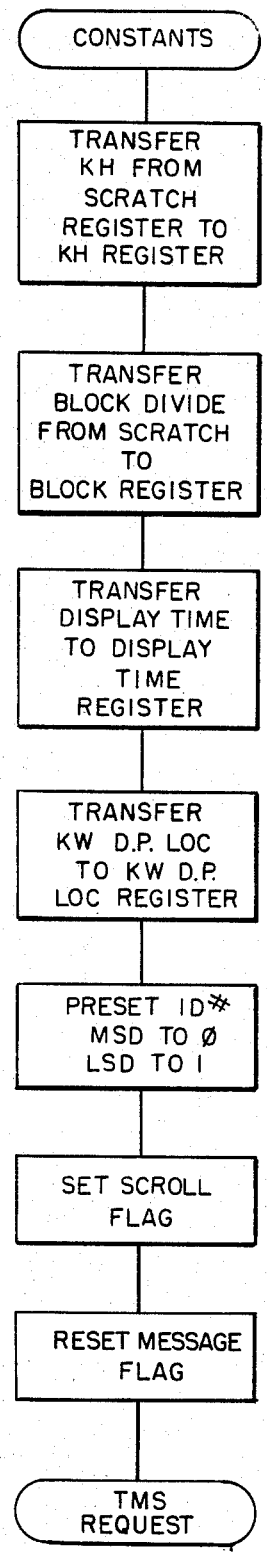
FIG. 13 is a flow chart depicting the functions performed by the processor/controller in loading constants.

Referring to FIG. 13, the constants load routine proceeds as follows. First, the quantity contained in the Kh portion of the message, which has been stored in the comm input scratch register location of RAM, is transferred into the Kh register locations of RAM. The contents of the block divide portion of the constants load message is transferred from the scratch register to the block divide register of RAM. The contents of the display time portion of the constants message is transferred from the scratch register to the display time register location. The contents of the KWDP portion of the constance message is transferred from the scratch register to the KWDP location register location of RAM. Next, the most significant digit of the ID Number register in RAM is set to zero and the least significant digit is set to one. The scroll flag is then set and the message flag is reset at which time the processor is ready for the input of another message.

Note that in the preferred embodiment, after the constants routine has been performed, messages will be input to the display 10 in a predetermined sequential order. For example, the preferred embodiment of the apparatus of the present invention was developed for use with an apparatus for multiple rate metering of electrical energy. It was required that this apparatus display information in a certain predetermined sequence. Consequently, specific types of information input to the display device for display, is assigned a specific identification number. This number is sequentially assigned by incrementing the ID number register of the display controller and passing that on to the display for display in a preselected location. For this particular application of the multi-format display of the present invention, reference is made to co-pending U.S. patent application Ser. No. 578,315, now U.S. Pat. No. 4,465970, which is a continuation of Ser. No. 238,450, now abandoned, entitled "Method and Apparatus for Multiple Rate Metering of Electrical Energy", inventors Donald V. DiMassimo, John B. May, Brian C. Johnson and Jeffrey L. Cooper, which application is assigned to the assignee of the present invention, and which application is incorporated by reference herewith as if fully set forth herein. In accordance with the application described in the referenced patent application, a meter code identification number has no display identification number, however, this display is followed by 33 individual data displays, each one having a distinct identification number beginning with number 01 and ranging through number 33.

Figure 14:
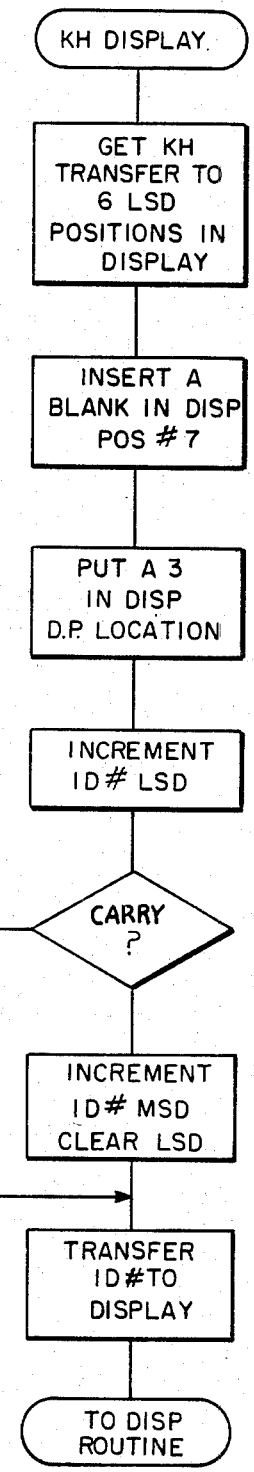
FIG. 14 is a flow chart depicting the functions performed by the processor/controller in formatting Kh data for display.

One of the quantities to be displayed is Kh which is a constant associated with a particular watt hour meter. Briefly, as is well known in the power metering art, there are meters which output a pulse which represents a predetermined amount of energy consumed by the metered power system. Such a meter is described in the above referenced patent application. The amount of energy represented this pulse is a constant for a particular meter identified as Kh. Referring now to FIG. 14, upon receipt of a message having a 1 in the format code location, the controller 12 transfers the value of Kh which has been stored in the Kh register location of the RAM to the six least significant digit locations in the display memory location in the RAM. A blank is inserted in display memory position 7. The quantity 3 is placed in the display decimal point location portion of the RAM. The least significant digit of the identification number is incremented then tested to see if there is a carry. If there is a carry, the most significant digit of the identification number is incremented and the least significant digit is cleared whereupon the identification number is transferred to the digit positions 8 and 9 of the display memory location in the RAM. Note that if there was no carry when the least significant digit of the identification number was incremented, the identification number would then be immediately transferred to positions 8 and 9 of the display memory location. After the data has been stored in the display memory location of RAM, the controller will then execute the display routine.

Figure 15:
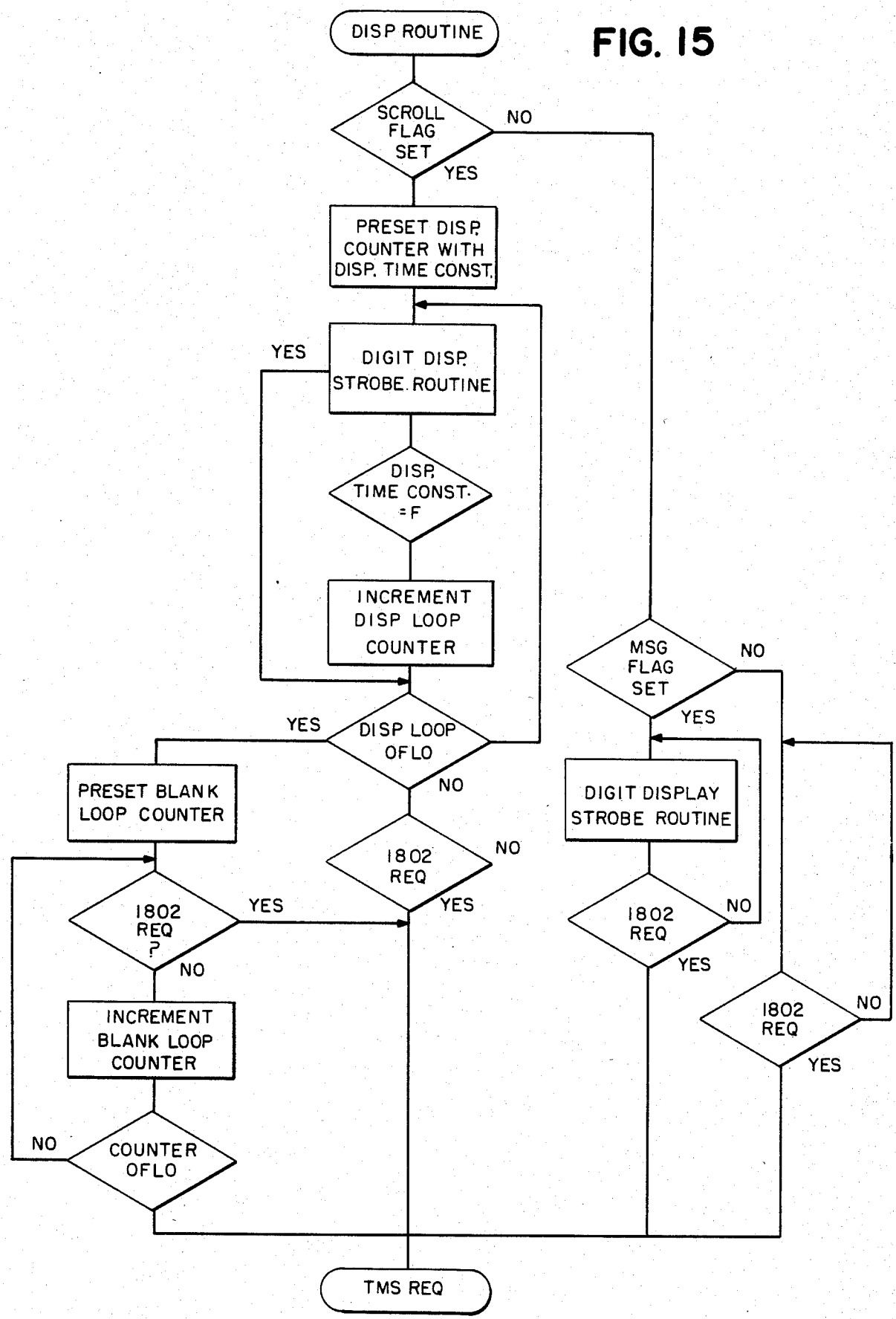
FIG. 15 is a flow chart depicting the functions performed by the processor/controller in generating display signals.

Referring to FIG. 15, there is a flow chart depicting the steps of the display routine. In the first step, the controller will check to see if the scroll flag is set. If the scroll flag is not set, it will then check to see if the message flag is set. If the message flag is not set, the controller will then check to see if there is an incoming data request. If no incoming data request, the controller will continue to check until there is an incoming data request at which time the controller will perform the steps of the communication link subroutine as previously described and shown in FIGS. 9 through 11. If the scroll flag is set, the controller will preset the display counter with the display time constant, the value of which was received and stored in the display time register location of the RAM during the constant load routine as previously described. A digit display strobe routine, which will subsequently be described in detail, is then performed whereafter the display time constant is tested to see if it is equal to F. If equal to F, this indicates, as previously described, that the message will be displayed until K4 transits from high to low. The controller will then test to see if there is an overflow in the display loop counter. If the display constant is not equal to F, the display loop counter is incremented and then tested to see if there is an overflow. If there is not an overflow, the controller checks to see if there is an incoming data request. If not, the controller will again perform the digit display strobe routine and follow the subsequent steps as previously described above. If there is an incoming data request, the controller will then perform the communication link subroutine as previously described and shown in FIGS. 9 through 11.

If there was not a display loop counter overflow, the controller will then preset the blank loop counter and test to see if there is an input data request. If there is an input data request, the controller will then perform the communication link subroutine. If there is no input data request, the controller will then increment the blank loop counter register to see if there is a counter overflow and if not will again test to see if there is an input data request. If there is a counter overflow, the controller will then perform the communication link subroutine as previously described. If the message flag had been set, instead of reset as previously described, the controller will perform the digit display strobe routine then check to see if there an input data request. If there is not an input data request, the controller will continue to perform the digit display strobe routine until there is an input data request at which time the controller would then proceed to perform the communication link subroutine as previously described.

Figure 16:
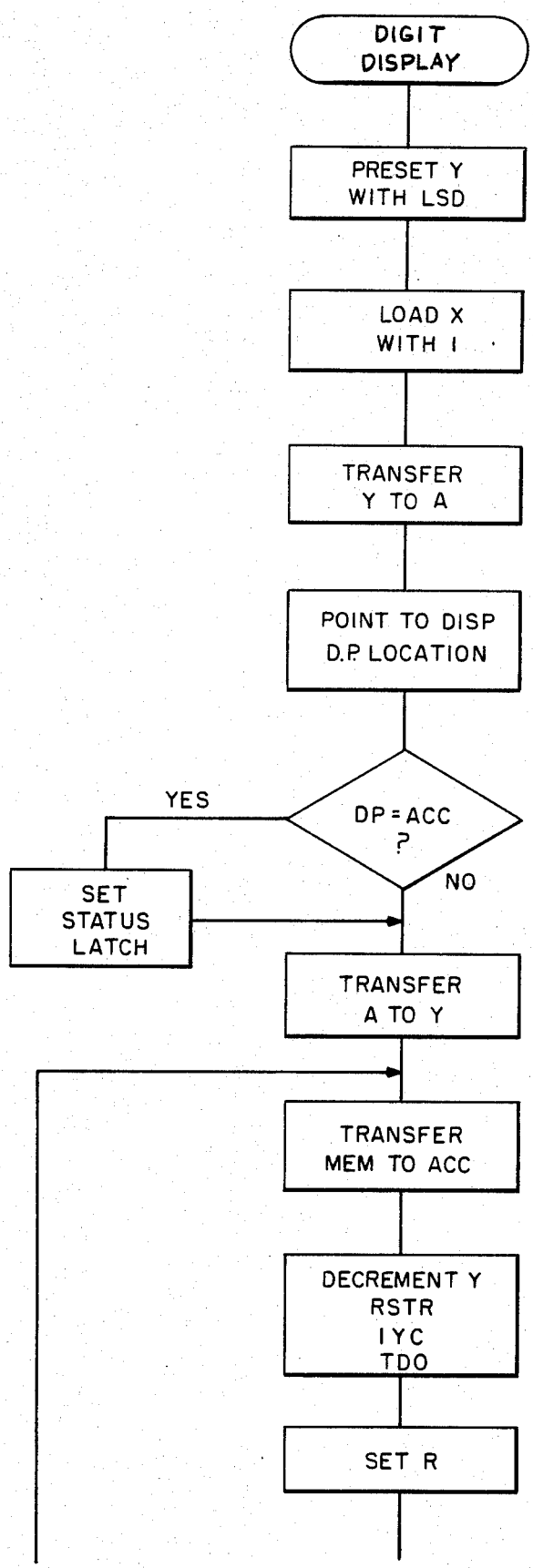
FIG. 16 is a flow chart depicting the functions performed by the processor/controller in performing a digit display strobe routine.
Figure 16:
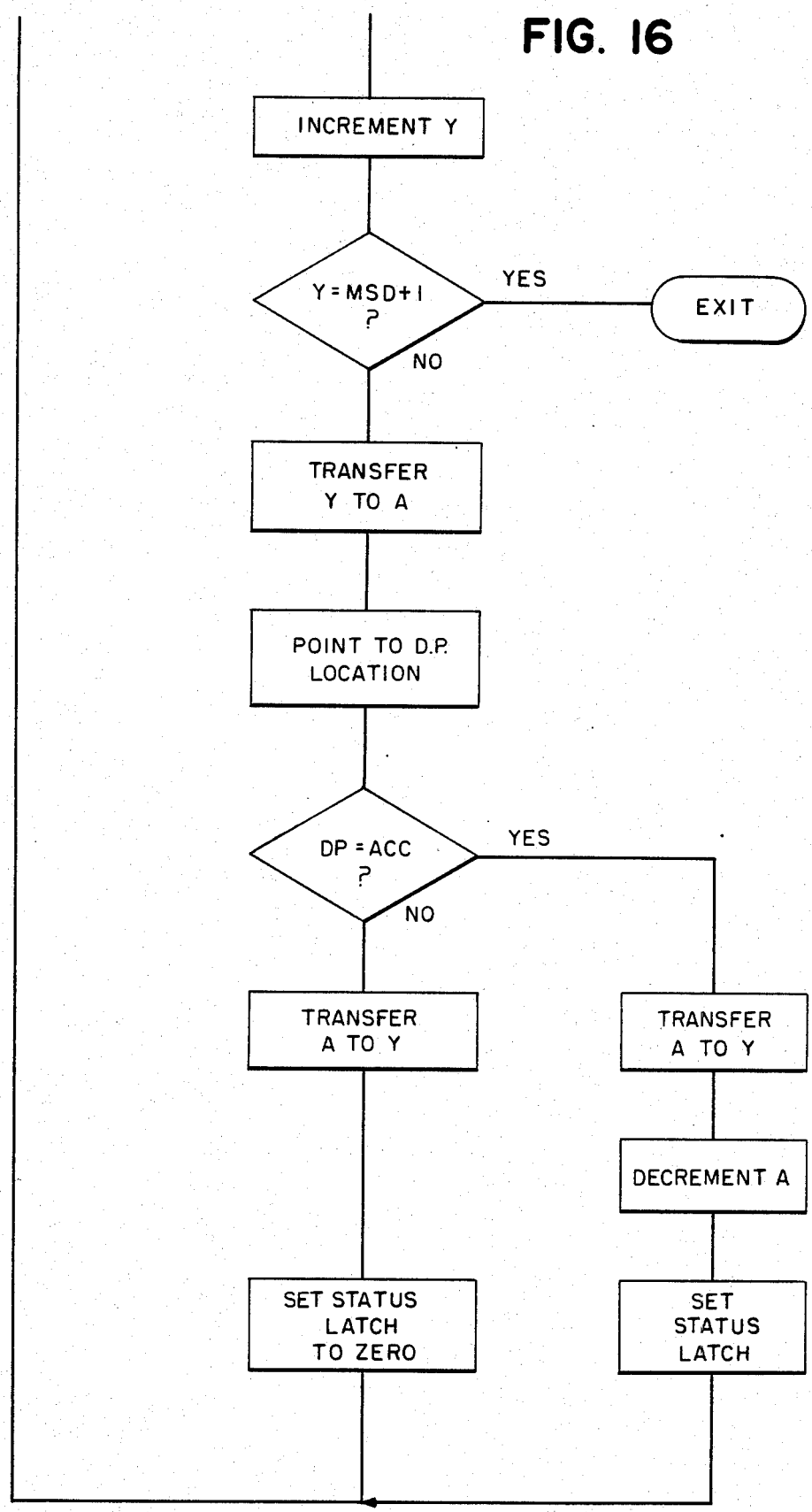

Referring to FIG. 16, there is shown a flow diagram of the steps of the digit display strobe routine. First, the Y register is preset with the least significant digit (LSD). The X register is then loaded with 1 and the contents of the Y register are transferred to the accumulator. Next the display decimal point location register is pointed to and the contents thereof are compared to the contents of the accumulator. If they are equal, the status latch is set, which means that the display will be formatted with a decimal point. If not equal, the contents of the accumulator are transferred to the Y register.

The value of the first digit is placed into the accumulator by transferring the memory location indicated by the Y register into the accumulator. The Y register is then decremented by one in order to point to the last digit strobe. The strobe line is then reset and the Y register is incremented by 1 in order to point to the digit strobe R. The value of this location is then transferred to the output code converter of the controller which decodes the four bits transferred from the accumulator into the seven line (00–06) display code. The digit strobe (R) is set and the Y register is then incremented by 1. The contents of the Y register are tested to see if they equal the most significant digit (MSD) plus 1. If they are equal, all digit values have been transferred to the output. If not equal 1, the contents of the Y register are transferred to the accumulator, the display decimal point location is pointed to and tested to see if the decimal point equals the contents of the accumulator. If not, the contents of the accumulator are transferred to the Y register, the status latch is reset, indicating no decimal point, and the memory location indicated by Y is transferred into the accumulator in order to get the current digit value into the accumulator as previously described. If the contents of the display decimal point location are equal to the contents of the accumulator, the accumulator contents are transferred to the Y register, the contents of the accumulator are decremented by 1, the status latch is set (indicating there is a display with decimal point) and the contents of the memory location indicated by the Y register are transferred to the accumulator in order to get the current digit value into the accumulator as previously described. This routine continues until all digits are strobed into the display.

Figure 17:
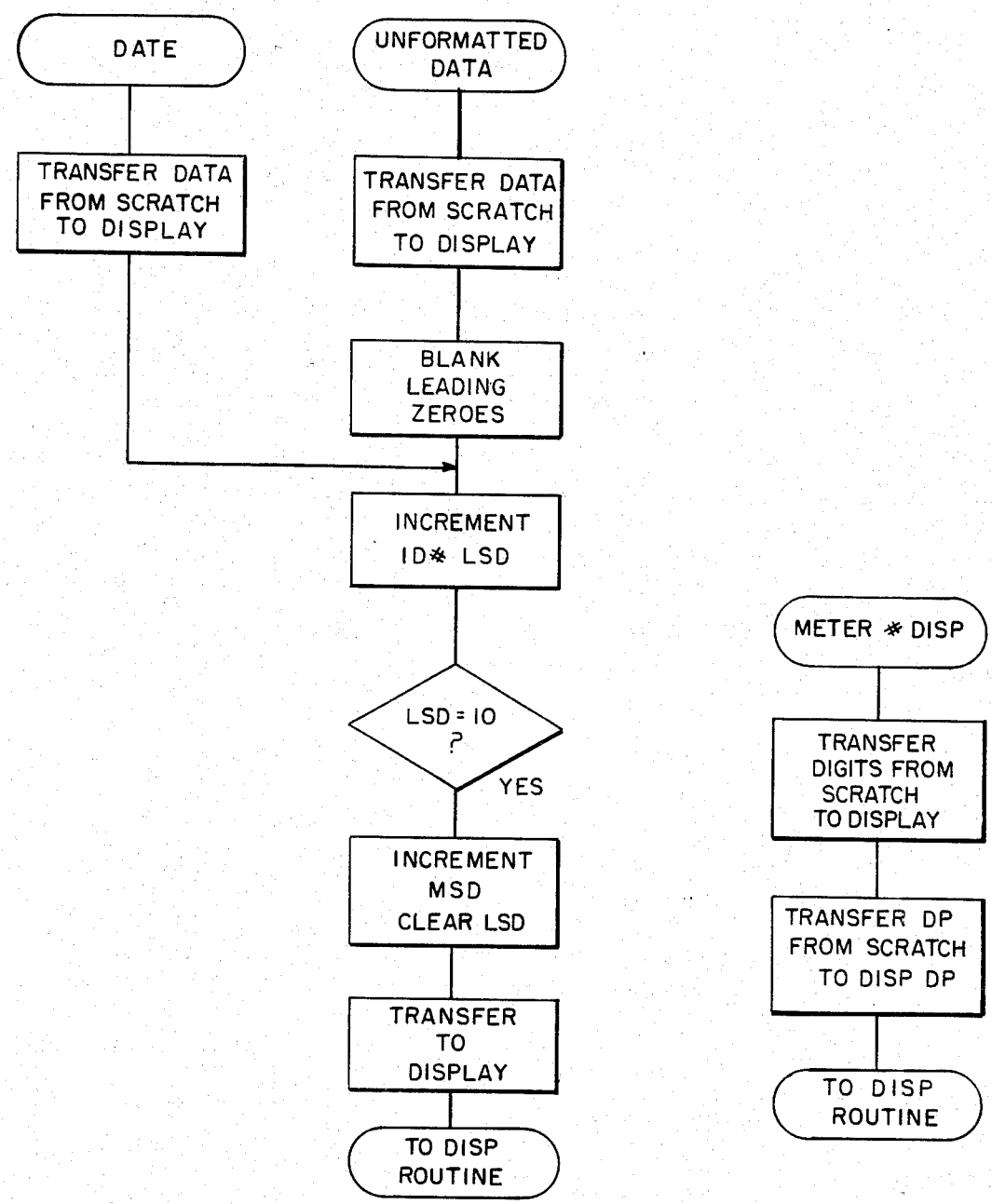
FIG. 17 is a flow chart depicting the functions performed by the processor/controller in performing date, unformatted data and meter number display routines.

Referring to FIG. 17 (a), there is shown the steps of the date and unformatted binary coded decimal (BCD) data display routines. If the format code portion of the incoming message has a value of 8, the controller will perform the steps of the date display routine portion of FIG. 17 (a). A date message contains the following information:

Number of nibbles=7
Format code=8
  Date comprises 6 nibbles of data In formatting the date display, the display identification digits are left justified, then a space, and then the date is displayed month, day and year. No decimal point is displayed in the date format. If the leading 0 is omitted, it is inserted and displayed. An example of a date display is:

| 01 | Δ | 10 | 25 | 80 |
|----|-----|----|-----|------|
| ID# | SP | Mo | Day | Year |

As shown in FIG. 17 (a), the controller transfers the data from the communication input scratch register location of RAM into the display memory location. The contents of the least significant digit (LSD) portion of the identification number register is incremented by one then tested to see if it is equal to 10. If it is equal to to 10, the most significant digit (MSD) portion of the identification number register is incremented one, the LSD portion is cleared and the contents of the identification number register is transferred to the two most significant digit locations of the display memory register. At this time, the controller will then perform the display routine as previously described. If the contents of the LSD portion of the identification number register is not equal to 10, the controller will then immediately transfer the contents of the identification number register to the two most significant digit locations in the display memory location and will then perform the display routine as previously described.

If the value of the format code portion of the incoming message is a 4, the controller will perform the steps of the unformatted binary coded decimal (BDC) data routine portion of FIG. 17 (a). An unformatted BCD data message contains the following information:
Number of nibbles=7
Format code=4
  6 nibbles of BCD data.
  Data is displayed as input with leading zeros blanked.
  No decimal point is displayed in this message.

Referring to the unformatted BCD data portion of the flow diagram of FIG. 17 (a), the controller will transfer the data received from the comm input scratch register to the display memory register of the RAM. The leading zeros in the display memory location will then be blanked. The remainder of the steps of this routine are identical to those previously described with respect to the date display commencing with the incrementing of the LSD portion of the identification number register.

If the format code portion of the incoming message is a 5, the controller will perform the steps of the meter number display routine shown in FIG. 17 (b). A meter identification number message contains the following information:

Number of nibbles=11
Format code=5
    9 nibbles of binary coded decimal data which is the meter identification number. In addition, there is 1 nibble containing decimal point location information.

In the preferred embodiment format, there is no display identification number associated with this particular display. If the input register is not filled, zeros take the place of the digits not used. Referring to FIG. 17 (b), the controller will transfer the digits from the comm input scratch register to the display memory register of the RAM. The controller will then transfer the contents of the decimal point location nibble to the display decimal point location register of the RAM. The controller then performs the display routine as previously described.

Figure 18:
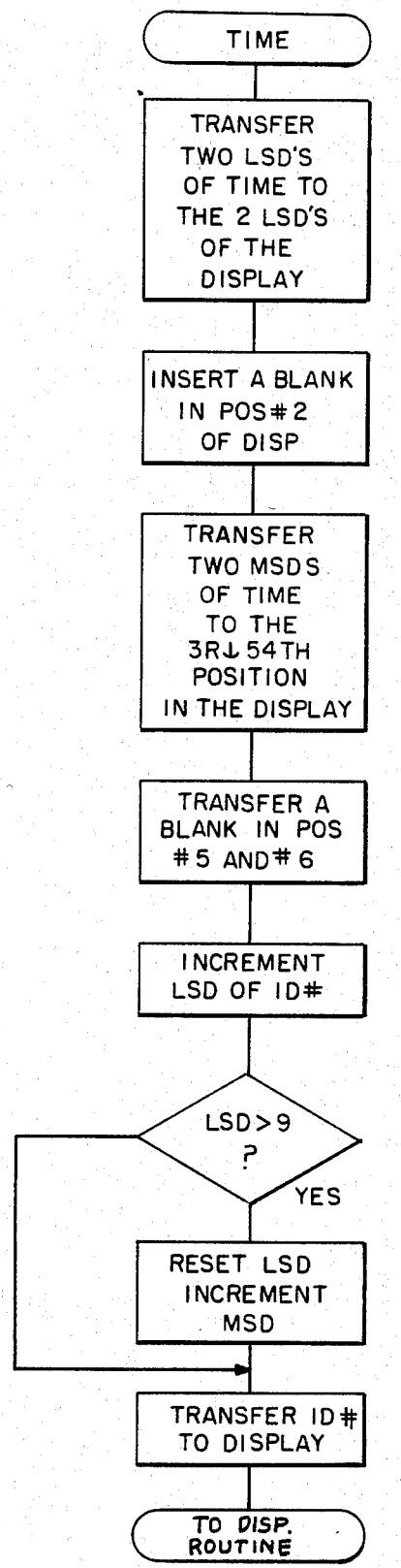
FIG. 18 is a flow chart depicting the functions performed by the processor/controller in performing a time display routine.

If the format code portion of the incoming message contains the value of 6, the controller will perform the time display routine shown in FIG. 18. The time display message contains the following information:

Number of nibbles=5
Format code=6
    4 nibbles of time information.

In the preferred embodiment of the time display, the display identification number is left justified, then a space, then the hour is displayed (2 digits), then another space, then the minutes are displayed (2 digits), then another space. No decimal point is displayed in the time display format. An example of the preferred embodiment of the time display format is:

| 02  | Δ  | 12 | Δ  | 15  | Δ  |
|-----|----|----|----|-----|----|
| ID# | SP | HR | SP | MIN | SP |

Referring to FIG. 18, the controller performs the time display routine by first inserting a blank in the least significant digit (LSD) location of the display memory register in RAM. Next, the controller transfers the two LSD's of the time data from the comm input register to the two LDS's of the display memory register. Next, the controller will insert a blank in position 4 of the display memory register. Next, the controller transfers the two most significant digits (MSD's) of the time data to the fifth and sixth positions in the display memory location. Next the controller inserts a blank in position seven of the display memory register and increments the LSD of the identification number register then tests to see if the LSD is greater than 9. If it is, the LSD is reset and the MSD portion of the identification number register is incremented by 1. The contents of the identification number register are then transferred to the two MSD's locations of the display memory register after which the controller will perform the display routine as previously described. If the contents of the LSD portion of the identification number register is equal to or less than 9, the controller will immediately transfer the contents of the identification number register to the two MSD's locations of the display memory register and then perform the display routine as previously described.

If the format code portion of the incoming message has a value of 2, the controller will perform a blank display routine, the steps of which are shown by a portion of FIG. 8. A blank display message contains the following information.

Number of nibbles=1
Format code=2
    This message causes the controller to place all blanks into the display and reset the scroll flag which in turn causes the display to blank and to remain blanked until the display controller is interrupted by a low on the data line input to K4 and a new format is sent.

Referring to FIG. 8, to perform the blank display routine, the controller first fills the display memory register of RAM with blanks and then resets the scroll flag. After this, the controller performs the display routine as previously described. As stated above, the display will remain filled with blanks until the controller is interrupted by a low on the K4 data line.

If the format code of the incoming message has a value equal to 3, the controller will perform a message display routine. A message display message contains the following information.

Number of nibbles=3-9
Format code=3
    2 to 8 nibbles of message data are included.

The leading zeros are ignored and the two most significant digits are left justified. All other lower digits are right justified. A space is placed between the two left justified digits and the lower digits. No decimal point is displayed in this message format. Referring to FIG. 8, when performing the message display routine, the controller first transfers the message data from the comm input scratch register to the display memory register of RAM. The controller then resets the scroll flag, sets a message flag and then performs the display routine as previously described.

If the format code portion of the incoming message contains a value of F (hexadecimal), the controller will perform the steps of the unformatted binary data routine depicted by a portion of FIG. 8. An unformatted binary data message contains the following information.

Number of nibbles=2-6
Format code=F (hexadecimal)
    1 to 5 nibbles of binary data having a value up to $99999_{10}$ Binary data is converted to BCD data whereafter the five LSD BCD numbers are then placed into the display with any leading zeros blanked.

In the preferred embodiment, the largest decimal number which can be displayed is $999999_{10}$ after which a roll-over to 0 occurs. The preferred format display shows the identification number left justified, then a space, then the BCD equivalent of the binary input with leading zeros blanked are displayed right justified. Example:

| 11  | Δ  | 99                        |
|-----|----|---------------------------|
| ID# | SP | BCD# (leading zeros blanked) |

Referring to FIG. 8, it can be seen that the steps of the unformatted binary data routine are the same as the steps of the unformatted BCD data routine with the exception that a binary to BCD conversion is first performed on the data contained in the comm input scratch register. Next, the converted data is placed into the display memory register following which the remaining steps, previously described with respect to the unformatted BCD data routine, are performed by the controller.

Figure 19:
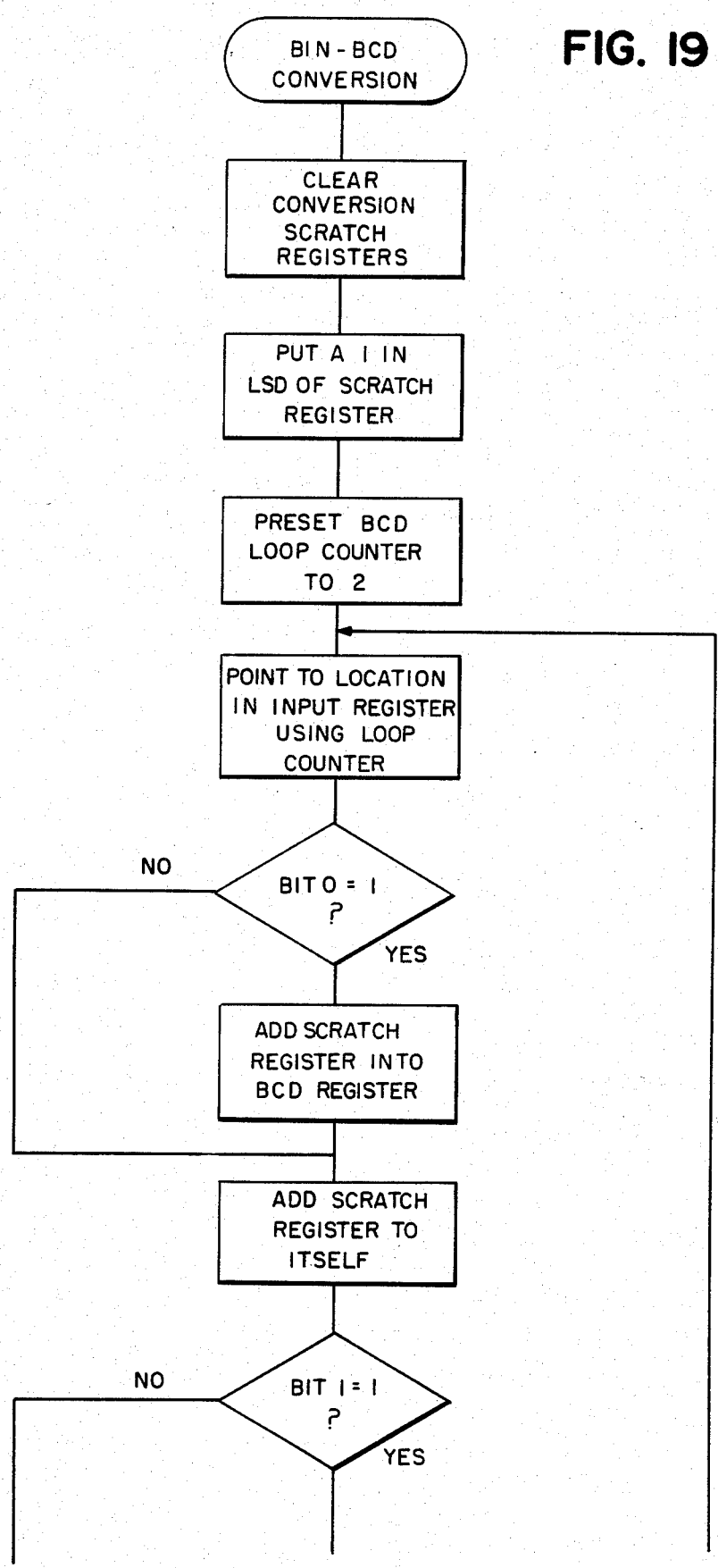
FIG. 19 is a flow chart depicting the functions performed by the processor/controller in performing a binary to BCD conversion routine.
Figure 19:
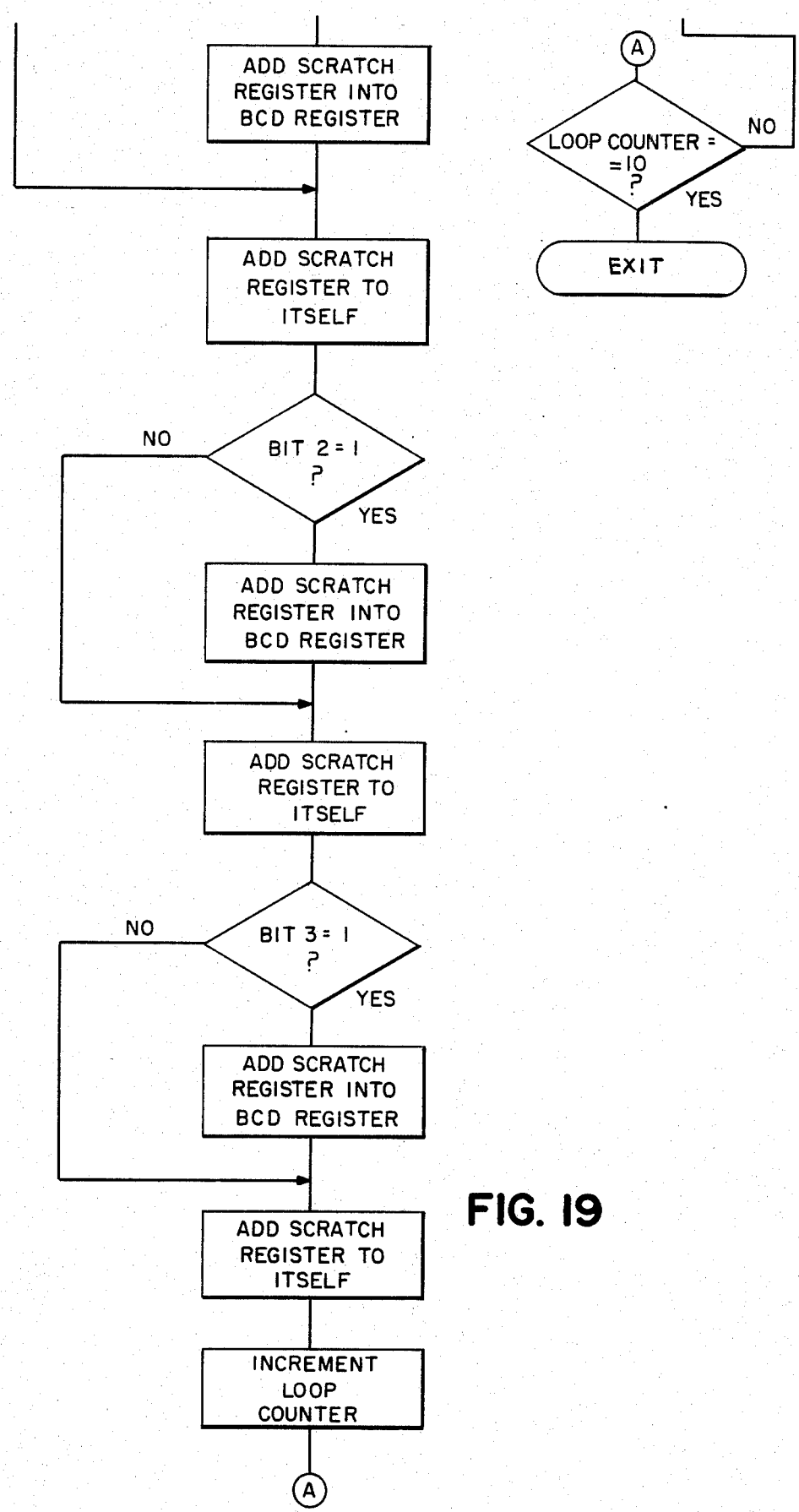

Referring to FIG. 19, there are shown the steps of the binary to BCD conversion routine of the preferred embodiment. The RAM memory map associated with the binary to BCD conversion routine, is shown in FIG. 6. It can be seen in FIG. 6 that the comm input scratch register contains the binary quantity which is to be converted to a BCD value. Referring to FIG. 19, it can be seen that the controller first clears the "binary—BCD conversion scratch register" and the "BCD answer after conversion register". The controller then puts a 1 in the LSD nibble location of the conversion scratch register. The BCD loop counter is then preset to 2. The loop counter is used to point to the correct nibble (or digit) location in the comm input scratch register. At this point in the routine, since the loop counter has been preset to 2, the controller will be working with the LSD binary value contained in nibble location 2. The controller will test bit 0 of this nibble to see if it equals 1. If it does equal 1, the controller adds the contents of the "binary—BCD conversion scratch register" (hereinafter referred to as the scratch register) into the "BCD answer after conversion register" (hereinafter referred to as the BCD register) following the steps of a BCD add routine which will be subsequently described. After this first addition, the controller will add the contents of the scratch register to itself using the BCD add routine. If bit 0 is not equal to one, the controller will immediately proceed to add the contents of the scratch register to itself.

Next, the controller will test bit 1 to see if it equals 1. If it does, it will add the contents of the scratch register into the BCD register then add the contents of the scratch register to itself as previously described. If bit 1 is not equal to 1, the controller will immediately proceed to the step wherein it adds the contents of the scratch register to itself. This procedure is followed for bits 2 and 3 of the nibble being worked on. At the end of bit 3, the loop counter is tested to see if it equals 10. If it does not equal 10, the controller will continue to test the bits of each subsequent nibble as previously described until the loop counter is equal 10 at which time the controller will proceed to reenter the subroutine previously being followed (in this case the unformatted binary data display subroutine).

Figure 20:
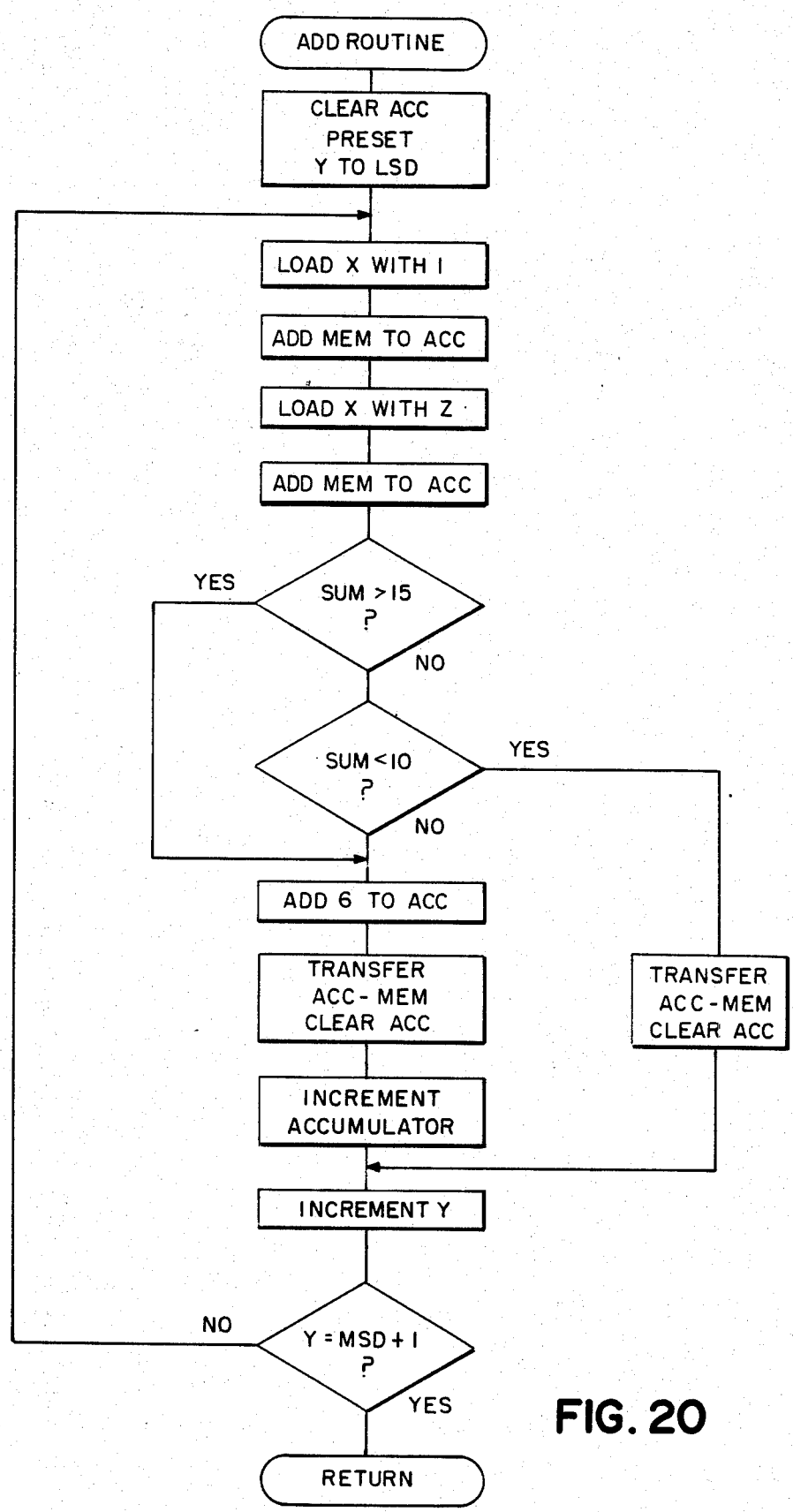
FIG. 20 is a flow chart depicting the functions performed by the processor/controller in performing a BCD add routine.

Referring to FIG. 20, there is shown a flow chart of the steps of the BCD add routine previously referred to. In performing this routine, the controller first clears the accumulator and presets the contents of the Y register with the value of the LSD of the quantity being added. Next, the controller will load the X register with 1 then add the contents of the scratch register digit being addressed into the accumulator. Next, the controller will load the X register with 2 and add the contents of the BDC register digit to the contents of the scratch register already in the accumulator. The controller then checks to see if the sum is greater than 15. If not, the controller then tests to see if the sum is less than 10 if it is not, the controller then adds 6 to the contents of the accumulator, transfers the contents of the accumulator to memory, clears the accumulator, increments the accumulator, then increments the Y register to point to the next digit location. At this time, the contents of the Y register is tested to see if it is equal to MSD+1. If equal, controller returns to the routine from which it came. If not equal, the controller then loads the X register with 1 and proceeds to carry out the steps previously described. Note that if the sum (that is the contents of the accumulator) is greater than 15, the controller proceeds directly to add 6 to the accumulator and carries out the remainder of the steps. Also, if the sum is less than 10, the controller transfers the contents of the accumulator to the appropriate BCD register memory location then increments Y and proceeds to carry out the remainder of the steps as previously described. As previously stated, after carrying out the binary to BCD conversion routine, the controller then performs the steps previously described with respect to the unformatted BCD data routine in order to display unformatted binary data.

If the format code portion of the incoming message is equal to 7, the controller will perform the steps of the kilowatt hour display routine, which is one of the routines shown in FIG. 8. A kilowatt hour display message contains the following information.
Number of nibbles=10 or 11
Format code=7
  8 nibbles containing the binary number representing the pulse counts received by the multiple rate metering apparatus previously referred to.
  1 nibble comprising a mode code ($E_{16}$ or $F_{16}$) which indicates that either a hyphen (-) or a blank ( ) is to be displayed in display position 6.

The binary count in the received message is converted to BCD and multiplied by the Kh constant which was input by the constants load routine as previously described. In the preferred embodiment format, the part of the resulting number which is greater than 1000 is displayed to five digits. For example, assuming a Kh value of 123.456 and that the number of pulses received equals 6553670, the display would be as follows:

| 05 | — | Δ | 08090 |
|---|---|---|---|
| ID# | Mode | SP | KWH |

Figure 22:
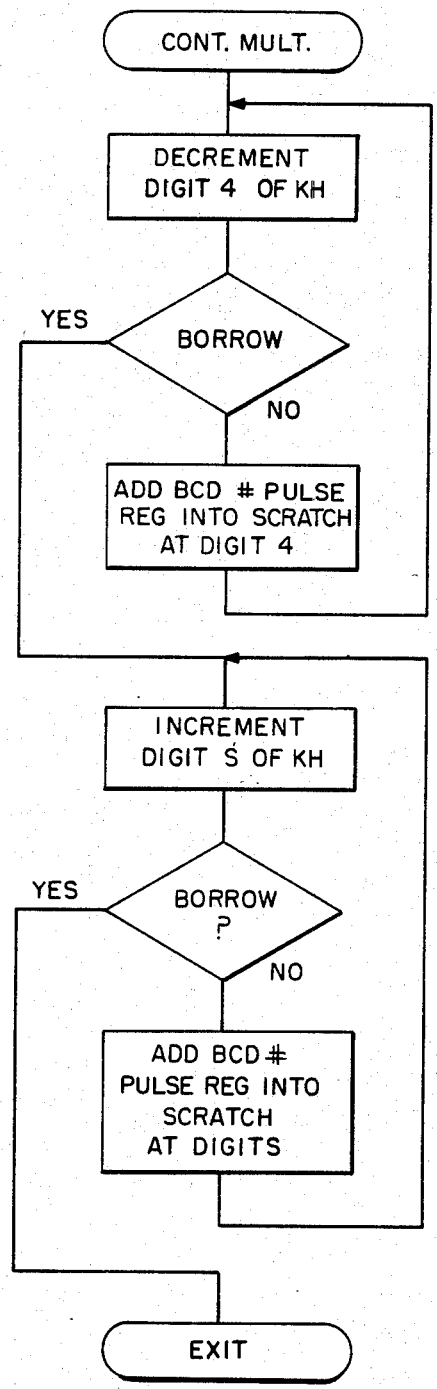
FIG. 22 is a flow chart depicting the functions carried out by the processor/controller in performing the BCD multiply routine, digits four and five.
Figure 21:
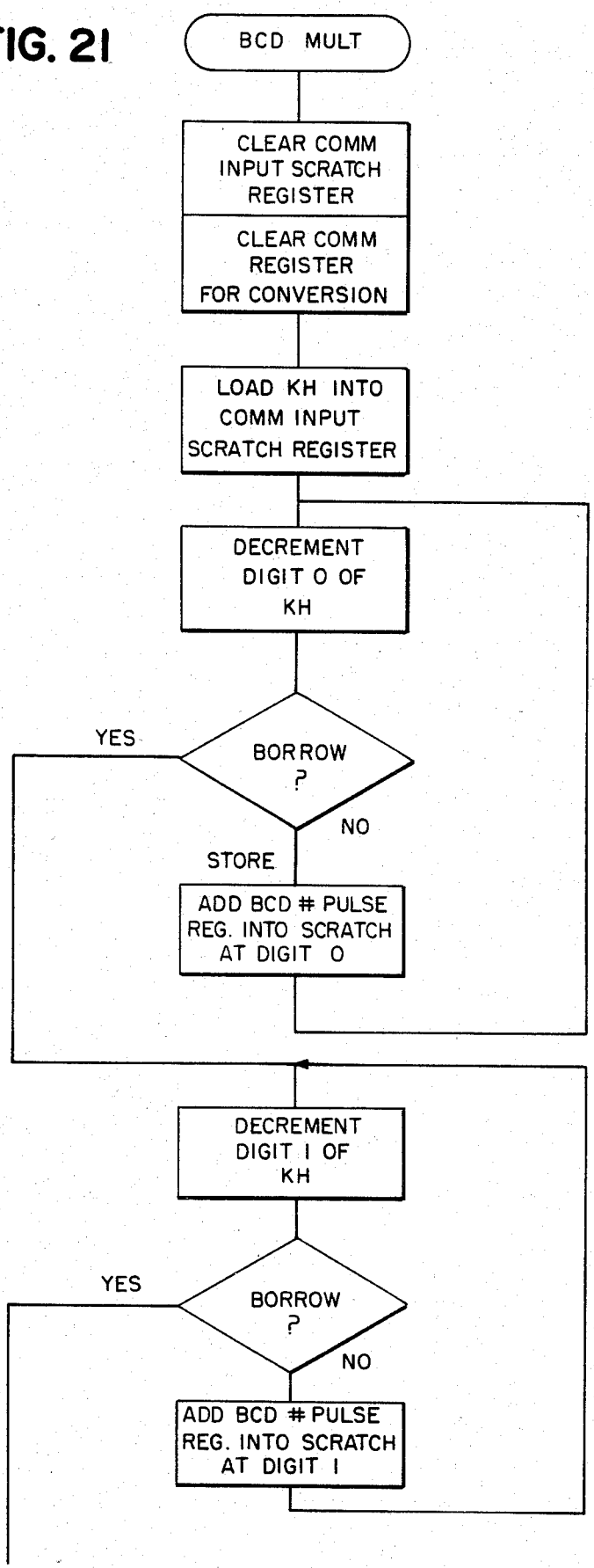
FIG. 21 is a flow chart depicting the functions performed by the processor/controller in performing a BCD multiply routine, digits zero through three.
Figure 21:
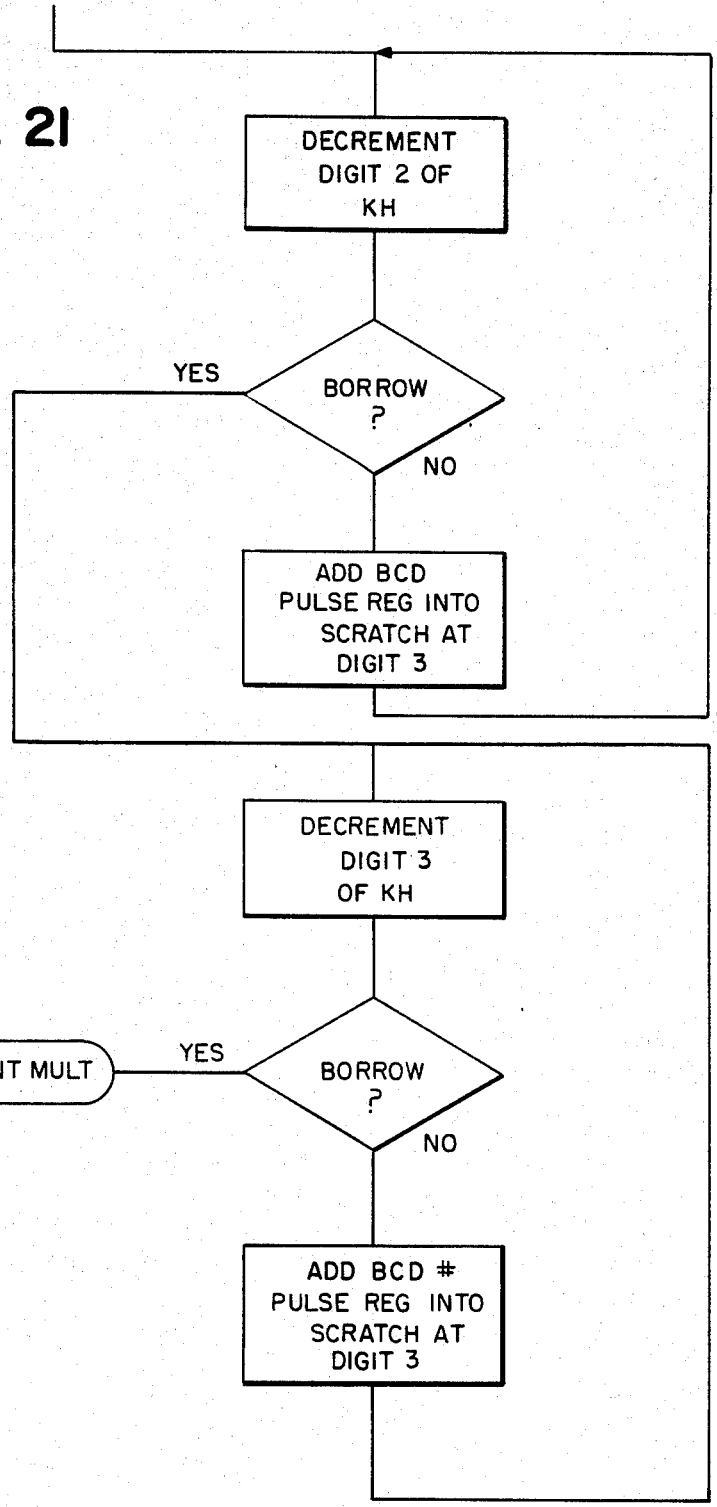

As shown in FIG. 8, when performing the kilowatt hour display routine, the controller will first perform a binary to BCD conversion as previously described. The controller will then perform a BCD multiply routine in order to multiply the binary count, which is now converted to BCD, by the value of Kh which was supplied by the constants load routine. FIG. 7 depicts the RAM memory map used when performing the BCD multiply routine and FIGS. 21 and 22 depict the steps used in performing that routine. Referring to FIG. 21, the controller will first clear the "Kh for multiply" memory locations and the "BCD conversion" memory locations. Next, the controller will load the value of Kh into the Kh for multiply register (hereinafter referred to as Kh). Next, controller will decrement digit 0 of Kh and test to see if there was a borrow. If no borrow, the controller will add the BCD number of the pulse register into the BCD conversion register (hereinafter referred to as the scratch register) at digit 0, using the add routine previously described. The controller will again decrement digit 0 of Kh, test for borrow and continue in this loop until, after testing for borrow, it is determined that there has been a borrow. At this time, the controller will decrement digit 1 of Kh, test for borrow and add the BCD number of the pulse register into the scratch register at digit 1 if no borrow occurred using the add routine as previously described. Again this loop will continue until there has been a borrow at which time the controller will decrement digit 2 of Kh and perform the steps previously described with digits 1 and 0. Controller will then proceed similarly through digits 3, 4 and 5 of Kh until there is a borrow indicated at digit 5 at which time the controller will have completed the BCD multiply routine. After completion of the BCD multiply routine, the controller will then insert a hypen or a blank in positions 6 of the display, depending on the value of the mode nibble previously described. The controller will then place a decimal point in the least significant digit of the display, transfer the five digits obtained after the BCD multiply into the display to the left of the decimal point, filling the LSD's of the display. The controller will then increment the identification number register, transfer these contents to the display register then perform the display routine as previously described.

If the format code portion of the received message is either a 9 or $A_{16}$, the controller will perform the kilowatt demand routine. A kilowatt demand display message contains the following information.

Number of nibbles=10 or 11
Format code=9 or $A_{16}$
    8 nibbles comprising the binary number value of the number of counts received by the multiple rate metering apparatus previously described.
    1 nibble containing a Mode code which, as previously described with respect to the kilowatt hour display, indicates whether or not a blank or a hyphen is to be displayed in display position 6.
    The binary count representing the number of pulses received is converted to BCD and multiplied by the $K_h$ value obtained from the constants load routine. The display is formatted with the kilowatt decimal point parameter (KWDP) also obtained from the constants load routine. 5 digits around the decimal point are displayed with either 0, 1, 2 or 3 places right of the decimal point displayed. For example:

| | | | | | |
|---|---|---|---|---|---|
| If KWDP = 0 | 5 digits | ID | — | Δ | 00001. |
| If KWDP = 1 | 5 digits | ID | — | Δ | 0001.2 |
| If KWDP = 2 | 5 digits | ID | — | Δ | 001.23 |
| If KWDP = 3 | 5 digits | ID | — | Δ | 01.234 |
| | | ID# | Mode | SP | KW |

As shown in FIG. 8, when performing the kilowatt demand routine, the controller will first perform a binary to BCD conversion of the binary count as previously described. The controller will then multiply the BCD value of the count by the BCD value of Kh using the BCD multiply routine as previously described. Next the controller will insert a hyphen or a blank in position 6, in accordance with the contents of the mode nibble. The controller will then shift the decimal point right in accordance with the value of the KWDP parameter obtained from the constants load routine. The controller then will transfer 5 digits left of the decimal point into the display LSD's. Next, KWDP will be placed into the display decimal point location whereupon the identification number will be incremented and transferred to the display register. The controller will then perform the display routine as previously described.

In the preferred embodiment, each display cycle must begin with a constants load routine. This sets all registers and flags for the following display sequence. Each ensuing display, except the meter identification number display, will have its own unique identification number showing its position in the scroll. The scroll will continue to advance the identification number of each display parameter until another group of constants is sent, at which time the identification number begins at 01 again. The receipt of a message or blank code stops the scroll and requires K4 to be taken low to interrupt either the message or blank, as previously described. To begin scrolling after a message or blank, new constants must be sent to the controller to reenable scrolling and automatic display time out.

If the K1 input is held to VSS on power up, the controller will begin a test routine which cycles through every output—programmable logic array (O-PLA) code to determine that the display 14 is functioning correctly. This test is stopped when K1 is allowed to go to VDD and the previous cycle is completed. The controller then goes to the communication link and begins looking for data upon completion of this test.

Figure 23:
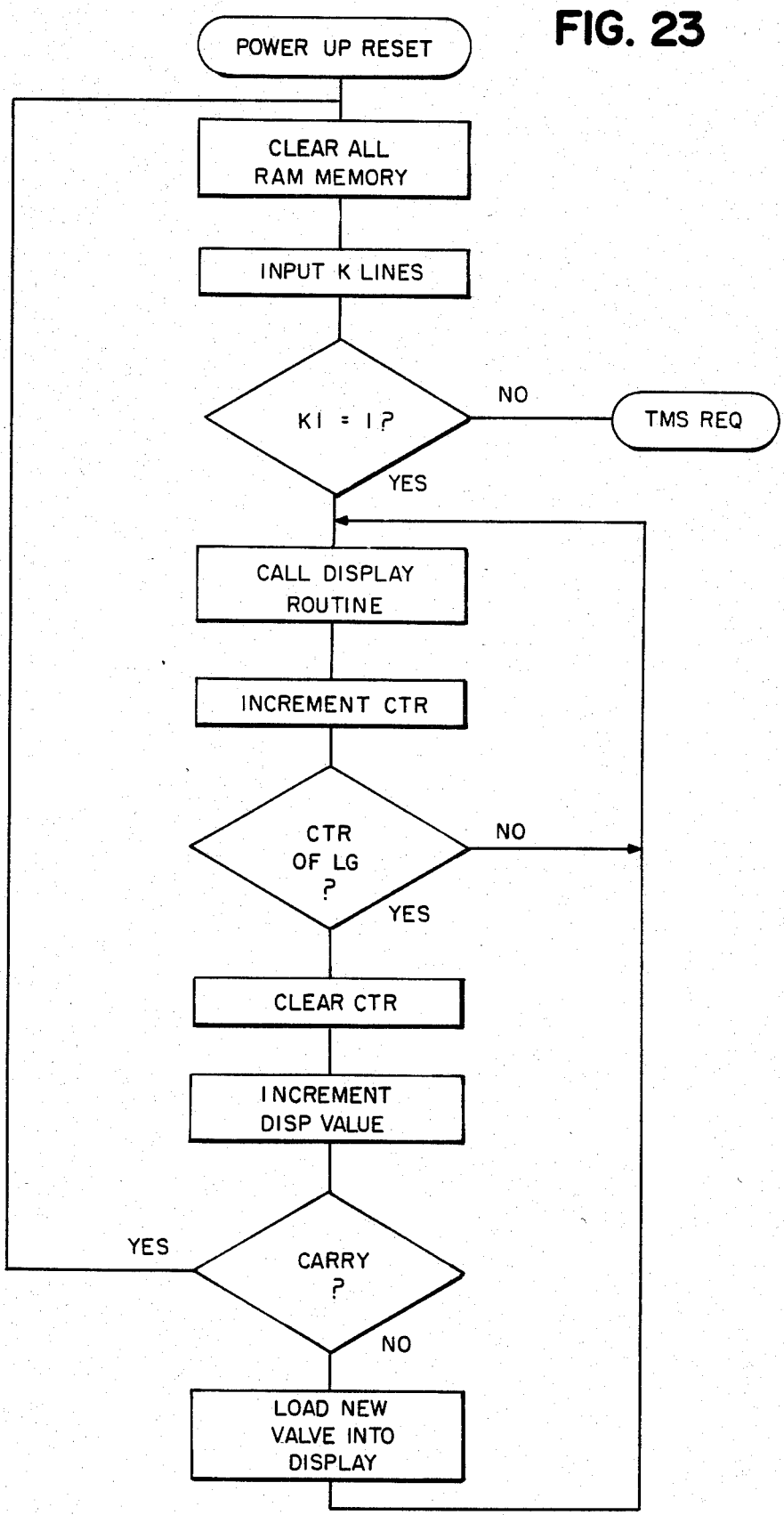

As shown in FIG. 8, the controller will perform a power up reset routine when initially powered. The steps of this routine are shown in FIG. 23. First, the controller will clear all RAM memory then input the information on the K lines into the K memory location. The controller then tests to see if K1 is equal to 1. If not, the controller will then perform the comm link subroutine as previously described. If K1 is equal to 1, the controller will then call the display routine, increment the counter then test to see if the counter has overflowed. If the counter has not overflowed, controller will again call the display routine and continue in this loop until there is a counter overflow. At this time, the controller will clear the counter, increment the display value and test to see if there is a carry. If there is a carry, controller will again return to the beginning of the routine, clear all RAM memory and continue to perform the steps as previously described. If there is no carry, the controller will load new values into the display call the display routine then increment the counter and form the remainder of the steps previously described.

It can be seen from the previous detailed description, that the multi-format data display apparatus of the present invention affords an extremely versatile display having a relatively simple interface with the equipment supplying the data to be displayed. The display is capable of accepting data in either binary or binary coded decimal formats, can display this particular data in preselected formats for preselected lengths of time. In addition, the apparatus includes the capability of scaling selected input data using preselected constants.

While the principles of the invention have now been made clear in an illustrative embodiment, there will be immediately obvious to those skilled in the art, many modifications of structure, arrangement, the elements, material, and components used in the practice of the invention otherwise, which are particularly adapted for specific environments and operating requirements without departing from those principles. The appended claims are therefore, intended to include and embrace any such modifications within the limits only of the true spirit and scope of the invention.

What is claimed is:

1. A multi-format display apparatus for receiving data words from a data source and displaying data contained in the data words in a plurality of different formats, said multi-format display apparatus comprising:
   a. display means for displaying data;
   b. a display processor under programmed control interconnected between said data source and said display means for formatting the data contained within the data words and transferring the formatted data to said display means for display thereon, the data words provided by said data source having a predetermined format and being in the form of a series of asynchronous digital data bits, each data word including a sync code portion comprising a predetermined pattern of serial data bits and a message portion comprised of at least a decodable format code segment and a data segment, said display processor comprising,
      (i) means for receiving the asynchronous digital data bits from said data source, including means for recognizing the predetermined sync code pattern in the sync code portion of each data word received and indicating when each received data word has been stored in said display processor,
      (ii) first register means for sequentially storing the message portion of each data word received by said means for receiving after recognition of the predetermined sync code pattern of each received data word by said means for recognizing,
      (iii) means for decoding the contents of the format code segment of the message portion of each data word after storage in said first register means as indicated to said means for decoding by said means for recognizing, and for selectively directing subsequent operations of said display processor by indicating which of several operations is to be performed as indicated by the resultant decoding of the format code segment of each data word stored in said first register means,
      (iv) second register means for storing preselected constants contained in the data segment of the message portion of a first data word stored in said first register means as directed by said means for decoding of the format code segment of said first data word,
      (v) third register means for storing data to be displayed,
      (vi) means for selectively formatting data contained in the data segment of the message portion of a second data word stored in said first register means, including means for selectively modifying specified ones of the preselected constants stored in said second register means and selectively storing the formatted data and selected ones of the preselected constants in said third register means as directed by said means for decoding of the format code segment of said second data word and, subsequent to the storage of the formatted data and the preselected constants in said third register means, indicating that the contents of said third register means are to be transferred to said display means, and
      (vii) means for selectively transferring the formatted data and certain ones of the preselected constants from said third register means to said display means for display thereon when indicated by said means for selectively formatting.

2. The multi-format display apparatus of claim 1 wherein the data contained in the data segment of the message portion of either of said first and second data words is binary coded decimal data.

3. The multi-format display apparatus of claim 1 wherein one portion of the data contained in the data segment of the message portion of said first data word is binary coded decimal data and another portion is a binary quantity expressed in hexadecimal.

4. The multi-format display apparatus of claim 1 wherein the contents of the format code segment of said first and second data words is a binary value expressed in hexadecimal.

5. The multi-format display apparatus of claim 1 wherein the data contained in the data segment of the message portion of said first data word is binary data.

6. The multi-format display apparatus of claim 1 wherein said means for selectively formatting data includes means for multiplying the data contained in the data segment of said second data word by a one of the preselected constants stored in said second register means.

7. The multi-format display apparatus of claim 6 wherein said means for selectively formatting data includes means for converting binary data contained in the data segment of said second data word into binary coded decimal data.

8. The multi-format display apparatus of claim 1 wherein one of the preselected constants stored in said third register means by said means for selectively formatting data specifies the length of time that said display means displays the formatted data and preselected constants transferred to said display means by said means for transferring.

9. A method to be carried out in a multi-format display apparatus utilizing a display processor under programmed control for formatting data contained in data words sequentially provided to said display processor and displaying the formatted data in a plurality of different formats, the data words having a predetermined format and being in the form of a series of asynchronous digital data bits, each data word including a sync code portion comprising a predetermined pattern of serial data bits and a message portion comprised of at least a decodable format code segment and a data segment, said method comprising the steps of:
   a. recognizing the predetermined sync code pattern in the sync code portion of the sequentially provided data words to enable said display processor to receive each data word;
   b. decoding the contents of the format code segment of the message portion of each received data word to direct said display processor in subsequent operations;
   c. storing preselected constants contained in the data segment of the message portion of a first received data word as directed by the decoding of the format code segment of said first data word;
   d. selectively formatting data contained in the data segment of the message portion of a second received data word as directed by the decoding of the format code segment of said second data word while selectively modifying specified ones of the stored preselected constants of said first data word; and e. selectively displaying the formatted data and certain specified ones of the preselected constants in a format wherein at least a portion of the displayed data is of a different format than the format of the data contained in the data segment of the message portion of either of said first and second data words.

10. The method claim 9 wherein the step of recognizing the predetermined sync code pattern further includes the step of sequentially storing each data word prior to the step of decoding.

11. The method of claim 9 wherein the step of selectively formatting data further includes the step of multiplying the data contained in the data segment of said second data word by a one of the stored preselected constants of said first data word.

12. The method of claim 11 wherein the step of selectively formatting further includes the step of converting binary data contained in the data segment of said second data word into binary coded decimal data.

13. The method of claim 9 wherein the step of selectively formatting data further includes the step of storing the formatted data prior to the step of selectively displaying.

14. The method of claim 13 wherein the step of storing the formatted data further includes the step of storing said certain specified ones of the preselected constants.

* * * * *